(12) United States Patent
Ong et al.

(10) Patent No.: US 11,342,289 B2
(45) Date of Patent: May 24, 2022

(54) VERTICAL POWER PLANE MODULE FOR SEMICONDUCTOR PACKAGES

(71) Applicant: Intel Corporation, Santa Clara, CA (US)

(72) Inventors: Jenny Shio Yin Ong, Pinang (MY); Bok Eng Cheah, Pinang (MY); Jackson Chung Peng Kong, Pinang (MY); Seok Ling Lim, Kulim Kedah (MY); Kooi Chi Ooi, Pinang (MY)

(73) Assignee: INTEL CORPORATION, Santa Clara, CA (US)

( * ) Notice: Subject to any disclaimer, the term of this patent is extended or adjusted under 35 U.S.C. 154(b) by 23 days.

(21) Appl. No.: 17/087,667

(22) Filed: Nov. 3, 2020

(65) Prior Publication Data

US 2022/0068846 A1 Mar. 3, 2022

(30) Foreign Application Priority Data

Sep. 1, 2020 (MY) .............................. PI2020004492

(51) Int. Cl.
*H01L 23/64* (2006.01)
*H01L 23/498* (2006.01)
(Continued)

(52) U.S. Cl.
CPC ........... *H01L 23/642* (2013.01); *H01G 4/224* (2013.01); *H01L 21/4857* (2013.01);
(Continued)

(58) Field of Classification Search
CPC . H01L 23/642; H01L 21/4857; H01L 23/481; H01L 23/49833; H01L 24/16;
(Continued)

(56) References Cited

U.S. PATENT DOCUMENTS

| 2009/0194857 A1* | 8/2009 | Liu ..................... H01L 23/5385 257/676 |
| 2014/0035163 A1* | 2/2014 | Khan ................ H01L 23/49827 257/774 |

(Continued)

OTHER PUBLICATIONS

U.S. Appl. No. 16/987,405, filed Aug. 7, 2020, not published yet.
(Continued)

*Primary Examiner* — Mamadou L Diallo
(74) *Attorney, Agent, or Firm* — Viering, Jentschura & Partner mbB

(57) ABSTRACT

The present disclosure relates to a semiconductor package, that may include a package substrate, a base die arranged on and electrically coupled to the package substrate, and at least one power plane module arranged on the package substrate at a periphery of the base die. The power plane module may include a top surface and a bottom surface, and at least one vertical interleaving metal layer electrically coupled at the bottom surface to the package substrate. The semiconductor package may further include a semiconductor device including a first section disposed on the base die, and a second section disposed on the power plane module, wherein the second section of the semiconductor device may be electrically coupled to the at least one vertical interleaving metal layer at the top surface of the power plane module.

20 Claims, 11 Drawing Sheets

(51) Int. Cl.
  *H01L 23/48* (2006.01)
  *H01L 21/48* (2006.01)
  *H01G 4/224* (2006.01)
  *H01L 23/00* (2006.01)
  *H01L 25/18* (2006.01)

(52) U.S. Cl.
  CPC ...... *H01L 23/481* (2013.01); *H01L 23/49833* (2013.01); *H01L 24/16* (2013.01); *H01L 25/18* (2013.01); *H01L 2224/16145* (2013.01); *H01L 2224/16225* (2013.01); *H01L 2224/16265* (2013.01); *H01L 2924/152* (2013.01); *H01L 2924/19041* (2013.01); *H01L 2924/19103* (2013.01)

(58) Field of Classification Search
  CPC ........... H01L 25/18; H01L 2224/16145; H01L 2224/16225; H01L 2224/16265; H01L 2924/152; H01L 2924/19041; H01L 2924/19103; H01G 4/224
  See application file for complete search history.

(56) References Cited

U.S. PATENT DOCUMENTS

| | | | |
|---|---|---|---|
| 2014/0117552 A1* | 5/2014 | Qian | H01L 23/53228 257/762 |
| 2017/0011993 A1* | 1/2017 | Zhao | H01L 23/3114 |
| 2017/0034913 A1* | 2/2017 | Mu | H05K 1/0298 |
| 2017/0125332 A1* | 5/2017 | Song | H01L 21/4857 |
| 2018/0211900 A1* | 7/2018 | Gutala | G11C 7/04 |
| 2019/0131287 A1* | 5/2019 | Huang | H01L 25/162 |
| 2020/0066612 A1* | 2/2020 | Hung | H01L 23/055 |
| 2020/0075541 A1* | 3/2020 | Sturcken | H02M 3/158 |
| 2020/0091040 A1* | 3/2020 | Cheah | H01L 24/05 |
| 2020/0243448 A1* | 7/2020 | Qian | H01L 23/5385 |
| 2021/0132309 A1* | 5/2021 | Zhang | G02B 6/4214 |
| 2021/0280523 A1* | 9/2021 | We | H01L 21/4857 |

OTHER PUBLICATIONS

MY patent application No. PI2020002901, filed on Sep. 1, 2020, not published yet.

* cited by examiner

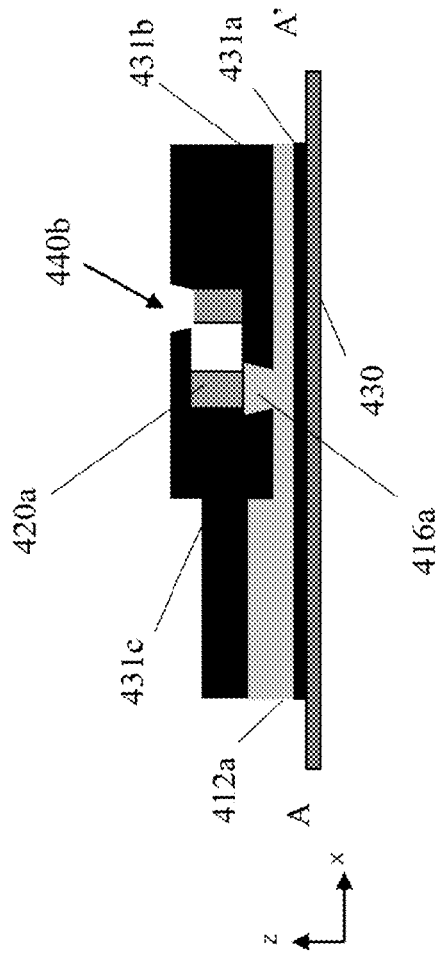
FIG. 4K
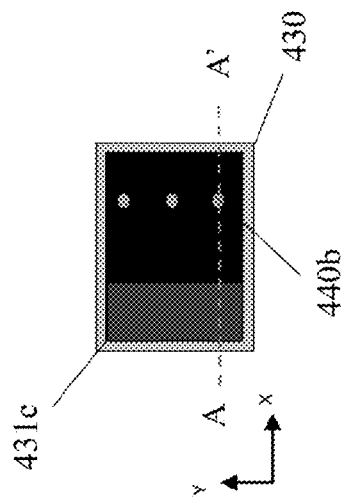
FIG. 4L
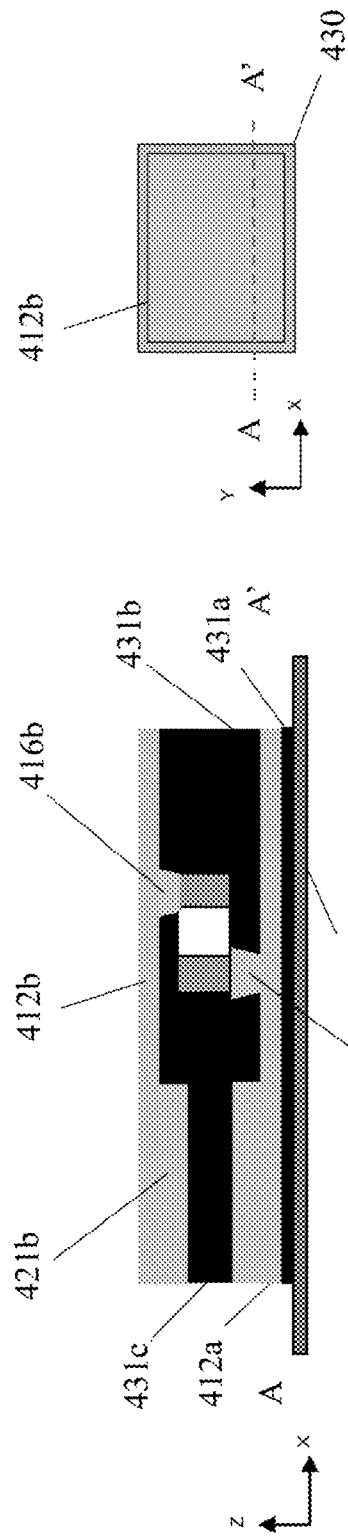
FIG. 4M
FIG. 4N

VERTICAL POWER PLANE MODULE FOR SEMICONDUCTOR PACKAGES

CROSS-REFERENCE TO RELATED APPLICATIONS

This application claims priority to Malaysian Patent Application No. PI2020004492, filed on Sep. 1, 2020, which is incorporated herein in its entirety.

BACKGROUND 2.5D packaging technology includes an assembly of two or more silicon chiplets with both homogeneous and/or heterogeneous silicon process node(s) on a silicon interposer (i.e., a base die) for improved signal bandwidth density and system miniaturization.

However, there are challenges faced by current 2.5D packaging technology. One of the challenges include power integrity (PI) performance (e.g., Fmax and Vmin) limitation of stacked chiplets or devices due to (a) additional IR drop losses across a redistribution layer (RDL) routing of the silicon interposer and through-silicon vias (TSVs) interconnects, (b) larger alternating current (AC) noise coupling due to an increased distance between stacked chiplets (i.e., circuit blocks), and package/board power delivery decoupling capacitors, and (c) Imax constraints ascribed to reduced TSV current-carrying capability.

Current 2.5D packaging technology also faces constraints of chiplet integration density scaling (i.e., number of stacked chiplets per interposer) due to a miniaturized interposer and package substrate footprint.

Existing solutions to address the above-mentioned challenges include (a) increment of platform voltage supply (e.g., from 0.9V to 1.1V) to ensure performance, (b) reduction of silicon $ICC_{Max}$ threshold to avoid reliability risk, (c) introduction of metal-insulator-metal (MIM) capacitance in stacked chiplets and/or silicon interposer to suppress power delivery network peak impedance ($Z_{PDN}$), and (d) silicon interposer and/or package substrate footprint expansion to allow increased chiplet device integration density.

However, disadvantages of the above-mentioned solutions include (a) increased device power consumption, (b) electrical performance degradation, e.g., reduction of maximum frequency (Fmax) threshold, and (c) increased device form factor.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1A:
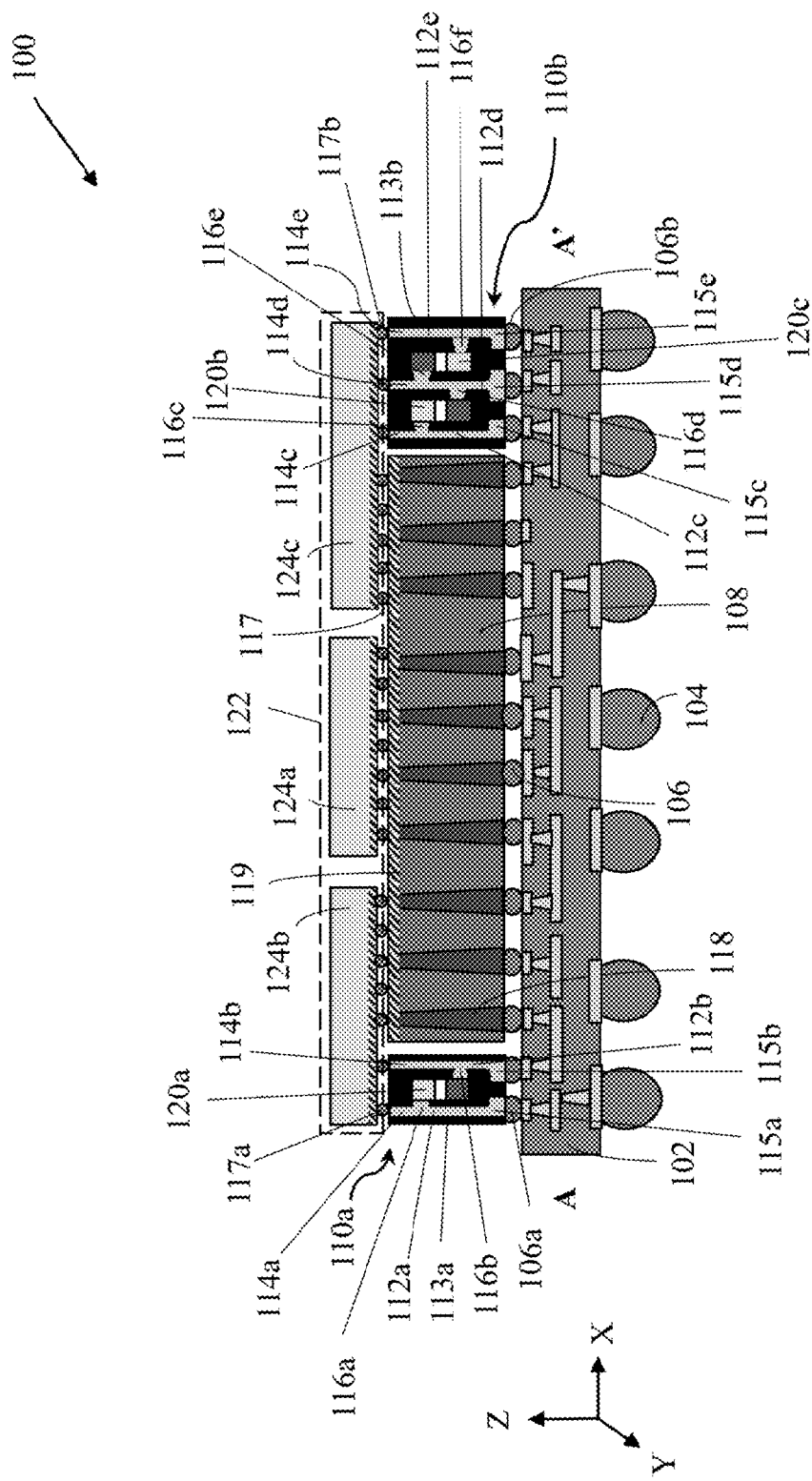
FIG. 1A shows a cross-sectional view of a semiconductor package with a peripheral vertical power plane module, according to an aspect of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

An advantage of the present disclosure may include mitigation of direct current (DC) and alternating current (AC) losses, e.g., Vmin and LL3 impedance reduction that may lead to computing Core and/or Graphics Fmax performance gain.

Another advantage of the present disclosure may include improved power integrity through parasitic power delivery network impedance ($Z_{PDN}$) reduction, allowing lower power supply voltage threshold thus minimizing device power consumption.

A further advantage of the present disclosure may include improved Imax capacity (device reliability) through a peripheral vertical power plane module. Reduced interconnect resistance may be achieved through increased interconnect volume, i.e., a vertical plane interconnect configuration between chiplets and a package substrate compared to a discrete cylindrical interconnect with constrained geometry, e.g., a through mold via (TMV) or a through silicon via (TSV) through a base die or silicon interposer.

A yet further advantage may include a reduction of the base die or silicon interposer footprint and improved package warpage.

The present disclosure generally relates to a device, e.g. a semiconductor package, that may include a package substrate, a base die on and electrically coupled to the package substrate, and at least one power plane module on the package substrate at a periphery of the base die. The power plane module may include a top surface and a bottom surface, and at least one vertical interleaving metal layer electrically coupled at the bottom surface to the package substrate. The semiconductor package may further include a semiconductor device including a first section disposed on the base die, and a second section disposed on the power plane module, wherein the second section of the semiconductor device may be electrically coupled to the at least one vertical interleaving metal layer at the top surface of the power plane module. As used herein, the term "vertical interleaving metal layer" may refer to a metal layer that is parallel to a side surface of the base die.

In various aspects of the present disclosure, the at least one vertical interleaving metal layer may further include a plurality of interleaving metal layers. Each of the plurality of interleaving metal layers may further include a top portion coupled to the semiconductor device, and a bottom portion coupled to the package substrate, wherein the bottom portion has a larger width than a width of the top portion.

In various aspects of the present disclosure, the semiconductor device may include a passive component coupled to the plurality of interleaving metal layers.

In various aspects of the present disclosure, the semiconductor device may include a plurality of trenches coupled to the plurality of interleaving metal layers. As used herein, a "trench" may refer to a raised section.

In various aspects of the present disclosure, the semiconductor device may include trenches arranged in an interdigital arrangement.

The present disclosure also generally relates to a computing device. The computing device may include a circuit board, and a semiconductor package coupled to the circuit board, wherein the semiconductor package may include a package substrate, a base die on and electrically coupled to the package substrate, at least one power plane module on the package substrate at a periphery of the base die, the power plane module including a top surface and a bottom surface, and at least one vertical interleaving metal layer electrically coupled at the bottom surface to the package substrate, and a semiconductor device including a first section disposed on the base die, and a second section disposed on the power plane module, wherein the second section of the semiconductor device is electrically coupled to the at least one vertical interleaving metal layer at the top surface of the power plane module.

The present disclosure further generally relates to a method. The method may include forming a package substrate, forming a base die on the package substrate, forming a power plane module at a periphery of the base die, the power plane module may include a top surface and a bottom surface and at least one vertical interleaving metal layer electrically coupled at the bottom surface to the package substrate, forming a semiconductor device including a first section disposed on the base die, and a second section disposed on the power plane module, wherein the second section of the semiconductor device is electrically coupled to the at least one vertical interleaving metal layer at the top surface of the power plane module.

To more readily understand and put into practical effect the present disclosure, particular aspects will now be described by way of examples and not limitations, and with reference to the drawings. For the sake of brevity, duplicate descriptions of features and properties may be omitted.

FIG. 1A shows a cross-sectional view of a semiconductor package 100 according to an aspect of the present disclosure. The cross-section is taken along the A-A' line of FIG. 1B.

In the aspect shown in FIG. 1A, the semiconductor package 100 may include a package substrate 102. The package substrate 102 may include contact pads, electrical interconnects, routings, and other features, which may or may not be shown in any of the present figures and which are conventional features known to a person skilled in the art. Various couplings of the components may use conventional methods, including solder bonding, thermal compression bonding, or other metal diffusion method. The package substrate 102 may have one or more rigid core layer for improved structural stability or a coreless substrate package for a reduced form-factor. In other aspects, the package substrate 102 may be part of a larger substrate that supports additional semiconductor packages, and/or components.

In an aspect, the semiconductor package 100 may include a plurality of solder balls 104. The package substrate 102 may be connected to a motherboard (not shown) through the plurality of solder balls 104. The plurality of solder balls 104 may also provide an electrical connection between the package substrate 102, and the motherboard. In an aspect, the stacked semiconductor package 100 may include a plurality of package bumps 106 disposed on the package substrate 102. The plurality of package bumps 106 may be controlled collapse chip connection (C4) bumps.

In an aspect of the present disclosure, the semiconductor package 100 may include a base die 108. The base die 108 may be an active interposer or a passive interposer. In an aspect, the base die 108 may be disposed on the package substrate 102. In an aspect, the base die 108 may be connected to the package substrate 102 through the plurality of package bumps 106. The plurality of package bumps 106 may also provide an electrical connection between the base die 108, and the package substrate 102.

In an aspect of the present disclosure, the base die 108 may include at least one through-silicon via (TSV) 118. The plurality of package bumps 106 may provide an electrical connection between the at least one TSV 118, and the package substrate 102.

In an aspect of the present disclosure, the semiconductor package 100 may include a first power plane module 110a. In an aspect, the first power plane module 110a may be disposed on the package substrate 102. In an aspect, the first power plane module 110a may be connected to the package substrate 102 through a plurality of package bumps 106a. In an aspect, the first power plane module 110a may be disposed at a first periphery of the base die 108.

In an aspect of the present disclosure, the first power plane module 110a may include a plurality of vertical interleaving metal layers (112a, 112b) electrically coupled to the package substrate 102 at a bottom surface of the first power plane module 110a. As used herein, the term "vertical interleaving metal layer" may refer to a metal layer that is parallel to a side surface of the base die 108. In the aspect shown in FIG. 1A, the first power plane module 110a may include a first metal layer 112a and a second metal layer 112b, interleaved with a dielectric layer. In an aspect, the first power plane module 110a may include a first mold portion 113a. The first mold portion 113a may include a molding material, such as epoxy resin polymer, silicone polymer, or polyimide material. The first mold portion 113a may have a first mold surface coupled to the package substrate 102. The first mold portion 113a may have a second mold surface coupled to a semiconductor device 122. In an aspect, the first and second metal layers (112a, 112b) may be embedded in the molding material of the first mold portion 113a. The first and second metal layers (112a, 112b) may extend through the first mold surface and the second mold surface of the first mold portion 113a.

In an aspect of the present disclosure, the plurality of package bumps 106a may provide an electrical connection between the plurality of interleaving metal layers (112a, 112b) of the first power plane module 110a, and the package substrate 102.

In an aspect of the present disclosure, the semiconductor package 100 may include a second power plane module 110b. In an aspect, the second power plane module 110b may be disposed on the package substrate 102. In an aspect, the second power plane module 110b may be connected to the package substrate 102 through a plurality of package bumps 106b. In an aspect, the second power plane module 110b may be disposed at a second periphery of the base die 108.

In an aspect of the present disclosure, the second power plane module 110b may include a plurality of vertical interleaving metal layers (112c, 112d, 112e) electrically coupled to the package substrate 102 at a bottom surface of the second power plane module 110b. In the aspect shown in FIG. 1A, the second power plane module 110b may include a third metal layer 112c, a fourth metal layer 112d, and a fifth metal layer 112e, interleaved with dielectric layers. In an aspect, the second power plane module 110b may include a second mold portion 113b. The second mold portion 113b may include a molding material, such as epoxy resin polymer, silicone polymer, or polyimide material. The second mold portion 113b may have a first mold surface coupled to the package substrate 102. The second mold portion 113b may have a second mold surface coupled to a semiconductor device 122. In an aspect, the third metal layer 112c, the fourth metal layer 112d, and the fifth metal layer 112e may be embedded in the molding material of the second mold portion 113b. The third metal layer 112c, the fourth metal layer 112d, and the fifth metal layer 112e may extend through the first mold surface and the second mold surface of the second mold portion 113b.

In an aspect of the present disclosure, the plurality of package bumps 106b may provide an electrical connection between the plurality of interleaving metal layers (112c, 112d, 112e) of the second power plane module 110b, and the package substrate 102.

In an aspect of the present disclosure, the semiconductor package 100 may include the semiconductor device 122. In an aspect, the semiconductor device 122 may be made from any suitable semiconductor, such as silicon, or gallium arsenide. The semiconductor device 122 may be a semiconductor die, chip, or a set of chiplets, e.g., a system-on-chip (SOC), a central processing unit (CPU), a platform controller hub (PCH)/chipset, a memory device, a field programmable gate array (FPGA) device, or a graphic processing unit (GPU). In the aspect shown in FIG. 1A, the semiconductor device 122 may be a set of three chiplets (124a, 124b, 124c). In one aspect, the first chiplet 124a may include a CPU, the second chiplet 124b may include a PCH, and third chiplet 124c may include a GPU.

In an aspect of the present disclosure, the semiconductor device 122 may be at least partially disposed on the base die 108. The semiconductor device 122 may also be at least partially disposed on the first power plane module 110a. The semiconductor device 122 may further be at least partially disposed on the second power plane module 110b. In an aspect, the semiconductor device 122 may have a first section disposed on the base die 108. The semiconductor device 122 may have a second section disposed on the first power plane module 110a. The semiconductor device 122 may further have a third section disposed on the second power plane module 110b. In the aspect shown in FIG. 1A, the first chiplet 124a of the semiconductor device 122 may be disposed on the base die 108. The second chiplet 124b of the semiconductor device 122 may be partially disposed on the base die 108 and may be partially disposed on the first power plane module 110a. The third chiplet 124c of the semiconductor device 122 may be partially disposed on the base die 108 and may be partially disposed on the second power plane module 110b.

In an aspect of the present disclosure, at least a portion of the semiconductor device 122 may be electrically coupled to the package substrate 102 through the at least one TSV 118.

In an aspect of the present disclosure, at least a portion of the semiconductor device 122 may be electrically coupled to the package substrate 102 through the first and second metal layers (112a, 112b) at a top surface of the first power plane module 110a. In an aspect, each of the first and second metal layers (112a, 112b) may be configurable. Each of the first and second metal layers (112a, 112b) may be configured based on the power delivery requirements of the semiconductor package 100, to mitigate power delivery challenges for 2.5D and/or 3D stacked integrated circuit (IC) packaging architectures. For example, a size, width, and/or volume of each of the first and second metal layers (112a, 112b) may be configured to meet the power delivery requirements.

In an aspect of the present disclosure, the base die 108 has a cross-section in an x-z plane. In one aspect, the first and second metal layers (112a, 112b) may extend in a direction to form a respective plane (112a', 112b') that may be transverse (i.e., in a y-axis) to the cross-section of the base die 108. In the aspect shown in FIG. 1A and FIG. 1B, the first and second metal layers (112a, 112b) may extend in the y-axis along the periphery of the base die 108. In other words, the first and second metal layers (112a, 112b) may form a first conductive plane 112a', and a second conductive plane 112b', respectively, that may be transverse to the cross-section of the base die 108, thereby forming the first power plane module 110a. In an aspect, the plane formed by the first metal layer 112a may include a first voltage reference plane 112a'. The plane formed by the second metal layer 112b may include a second voltage reference plane 112b'.

In an aspect of the present disclosure, the first and second metal layers (112a, 112b) may have a same length, or different lengths (in the y-axis). The first and second metal layers (112a, 112b) may extend in the y-axis along the periphery of the base die 108 and parallel to each other. In one aspect, each of the first and second metal layers (112a, 112b) may extend from 30% to 120% of a length of the base die 108. For example, each of the first and second metal layers (112a, 112b) may include a length ranging from 5 millimeters (mm) to 20 mm.

In an aspect of the present disclosure, the first metal layer 112a may include a first chiplet side contact pad 114a and a first package side contact pad 115a. In an aspect, the first chiplet side contact pad 114a may be coupled to the semiconductor device 122. The first package side contact pad 115a may be coupled to the package substrate 102. Likewise, the second metal layer 112b may include a second chiplet side contact pad 114b and a second package side contact pad 115b. In an aspect, the second chiplet side contact pad 114b may be coupled to the semiconductor device 122. The second package side contact pad 115b may be coupled to the package substrate 102. In the aspect shown in FIG. 1A, each of the first and second metal layers (112a, 112b) may be arranged in a vertical orientation so that a shortest interconnect path may be formed between the second chiplet 124b, and the package substrate 102, thereby forming a first vertical power plane module 110a. In an aspect, the vertical plane formed by the first metal layer 112a may include a first vertical voltage reference plane 112a'. The vertical plane formed by the second metal layer 112b may include a second vertical voltage reference plane 112b'.

An advantage of the present disclosure may include improved Imax capacity (device reliability) through a peripheral vertical power plane module. Reduced interconnect resistance may be achieved through increased interconnect volume, i.e., a vertical plane interconnect configuration between chiplets and a package substrate compared to a discrete cylindrical interconnect with constrained geometry, e.g., a through mold via (TMV) or a through silicon via (TSV), through a base die or silicon interposer.

In an aspect of the present disclosure, the first chiplet side contact pad 114a, and the first package side contact pad 115a may have different widths (in the x-axis). The first chiplet side contact pad 114a may have a width of a first dimension. The first package side contact pad 115a may have a width of a second dimension. In an aspect, the second dimension may be larger than the first dimension. In other words, the first chiplet side contact pad 114a may have a smaller width than the first package side contact pad 115a. The first dimension may include a width geometry ranging from approximately 20 μm to 100 μm. The second dimension may include a width geometry at least 1.5 times larger than the first dimension.

In an aspect of the present disclosure, the second chiplet side contact pad 114b, and the second package side contact pad 115b may have different widths (in the x-axis). The second chiplet side contact pad 114b may have a width of a first dimension. The second package side contact pad 115b may have a width of a second dimension. In an aspect, the second dimension may be larger than the first dimension. In other words, the second chiplet side contact pad 114b may have a smaller width than the second package side contact pad 115b. The first dimension may include a width geometry ranging from approximately 20 μm to 100 μm. The second dimension may include a width geometry at least 1.5 times larger than the first dimension.

In an aspect of the present disclosure, the first metal layer 112a and the second metal layer 112b may have a same height (in the z-axis). The first and the second metal layers (112a, 112b) may include a height geometry ranging from approximately 200 μm to 800 μm.

In an aspect, the different dimensions of the first and second chiplet side contact pads (114a, 114b), and the first and second package side contact pads (115a, 115b) are achieved through a non-homogeneous vertical power plane thickness. In the aspect shown in FIG. 1A, a vertical stepped reference plane in an "L" shape configuration with a first plane thickness adjacent to a module chiplet side, and a second plane thickness greater than the first plane thickness adjacent to a module package side may be provided. In an aspect, similar effective volume of a conductor plane, e.g., same effective plane volume between the first plane thickness and the second plane thickness, may be achieved through configuring the ratios of the –x and –z axes between the first and second plane thicknesses.

In an aspect of the present disclosure, a first via 116a may be formed on the first metal layer 112a. A second via 116b may be formed on the second metal layer 112b. In an aspect, a first passive component 120a may be disposed between the first and second metal layers (112a, 112b). The first passive component 120a may include a capacitor, such as a silicon capacitor, or a ceramic capacitor, such as a multi-layer ceramic capacitor (MLCC), a resistor, a diode, or an inductor. In an aspect, the first passive component 120a may be used for improving power integrity of the semiconductor package 100. In the aspect shown in FIG. 1A, a body length of the first passive component 120a, e.g., a decoupling capacitor, may be arranged along the z-axis. In an aspect, a first terminal of the first passive component 120a may be electrically coupled to the first metal layer 112a through the first via 116a. The first terminal of the first passive component 120a may include a negative terminal. A second terminal of the first passive component 120a may be electrically coupled to the second metal layer 112b through the second via 116b. The second terminal of the first passive component 120a may include a positive terminal. In other words, the first passive component 120a may be coupled to the first vertical voltage reference plane 112a', and may be further coupled to the second vertical voltage reference plane 112b' through the first and second vias (116a, 116b), respectively. This may result in AC noise reduction as the proximity of a decoupling passive component to the semiconductor device 100 may reduce power supply induced jitter, which may lead to electrical performance improvements.

In an aspect, the first vertical voltage reference plane 112a' may be associated with a ground reference voltage (Vss). In an aspect, the second vertical voltage reference plane 112b' may be associated with a power reference voltage (Vcc).

In an aspect of the present disclosure, at least a portion of the semiconductor device 122 may be electrically coupled to the package substrate 102 through the third, fourth, and fifth metal layers (112c, 112d, 112e) at a top surface of the second power plane module 110b. In an aspect, each of the third, fourth, and fifth metal layers (112c, 112d, 112e) may be configurable. Each of the third, fourth, and fifth metal layers (112c, 112d, 112e) may be configured based on the power delivery requirements of the semiconductor package 100, to mitigate power delivery challenges for 2.5D and/or 3D stacked integrated circuit (IC) packaging architectures. For example, a size, width, and/or volume of each of the third, fourth, and fifth metal layers (112c, 112d, 112e) may be configured to meet the power delivery requirements.

In an aspect of the present disclosure, the base die 108 has a cross-section in an x-z plane. In one aspect, the third, fourth, and fifth metal layers (112c, 112d, 112e) may extend in a direction to form a respective plane that may be transverse (i.e., in a y-axis) to the cross-section of the base die 108. In the aspect shown in FIG. 1A and FIG. 1B, the third, fourth, and fifth metal layers (112c, 112d, 112e) may extend in the y-axis along the periphery of the base die 108. In other words, the third, fourth, and fifth metal layers (112c, 112d, 112e) may form a third conductive plane 112c', a fourth conductive plane 112d', and a fifth conductive plane 112e', respectively, that may be transverse to the cross-section of the base die 108, thereby forming the second power plane module 110b. In an aspect, the plane formed by the third metal layer 112c may include a third voltage reference plane 112c'. The plane formed by the fourth metal layer 112d may include a fourth voltage reference plane 112d'. The plane formed by the fifth metal layer 112e may include a fifth voltage reference plane 112e'.

In an aspect of the present disclosure, the third, fourth, and fifth metal layers (112c, 112d, 112e) may have a same length, or different lengths (in the y-axis). The third, fourth, and fifth metal layers (112c, 112d, 112e) may extend in the y-axis along the periphery of the base die 108 and parallel to each other. In one aspect, each of the third, fourth, and fifth metal layers (112c, 112d, 112e) may extend from 30% to 120% of a length of the base die 108. For example, each of the third, fourth, and fifth metal layers (112c, 112d, 112e) may include a length ranging from 5 mm to 20 mm.

In an aspect of the present disclosure, the third metal layer 112c may include a third chiplet side contact pad 114c and a third package side contact pad 115c. In an aspect, the third chiplet side contact pad 114c may be coupled to the semiconductor device 122. The third package side contact pad 115c may be coupled to the package substrate 102. The fourth metal layer 112d may include a fourth chiplet side contact pad 114d and a fourth package side contact pad 115d. In an aspect, the fourth chiplet side contact pad 114d may be coupled to the semiconductor device 122. The fourth package side contact pad 115d may be coupled to the package substrate 102. The fifth metal layer 112e may include a fifth chiplet side contact pad 114e and a fifth package side contact pad 115e. In an aspect, the fifth chiplet side contact pad 114e may be coupled to the semiconductor device 122. The fifth package side contact pad 115e may be coupled to the package substrate 102. In the aspect shown in FIG. 1A, each of the third, fourth, and fifth metal layers (112c, 112d, 112e) may be arranged in a vertical orientation so that a shortest interconnect path may be formed between the third chiplet 124c, and the package substrate 102, thereby forming a second vertical power plane module 110b. In an aspect, the vertical plane formed by the third metal layer 112c may include a third vertical voltage reference plane 112c'. The vertical plane formed by the fourth metal layer 112d may include a fourth vertical voltage reference plane 112d'. The vertical plane formed by the fifth metal layer 112e may include a fifth vertical voltage reference plane 112e'.

In an aspect of the present disclosure, the third chiplet side contact pad 114c, and the third package side contact pad 115c may have different widths (in the x-axis). The third chiplet side contact pad 114c may have a width of a first dimension. The third package side contact pad 115c may have a width of a second dimension. In an aspect, the second dimension may be larger than the first dimension. In other words, the third chiplet side contact pad 114c may have a smaller width than the third package side contact pad 115c. The first dimension may include a width geometry ranging from approximately 20 µm to 100 µm. The second dimension may include a width geometry at least 1.5 times larger than the first dimension.

In an aspect of the present disclosure, the fourth chiplet side contact pad 114d, and the fourth package side contact pad 115d may have different widths (in the x-axis). The fourth chiplet side contact pad 114d may have a width of a first dimension. The fourth package side contact pad 115d may have a width of a second dimension. In an aspect, the second dimension may be larger than the first dimension. In other words, the fourth chiplet side contact pad 114d may have a smaller width than the fourth package side contact pad 115d. The first dimension may include a width geometry ranging from approximately 20 µm to 100 µm. The second dimension may include a width geometry at least 1.5 times larger than the first dimension.

In an aspect of the present disclosure, the fifth chiplet side contact pad 114e, and the fifth package side contact pad 115e may have different widths (in the x-axis). The fifth chiplet side contact pad 114e may have a width of a first dimension. The fifth package side contact pad 115e may have a width of a second dimension. In an aspect, the second dimension may be larger than the first dimension. In other words, the fifth chiplet side contact pad 114e may have a smaller width than the fifth package side contact pad 115e. The first dimension may include a width geometry ranging from approximately 20 µm to 100 µm. The second dimension may include a width geometry at least 1.5 times larger than the first dimension.

In an aspect of the present disclosure, the third, fourth, and fifth metal layers (112c, 112d, 112e) may have a same height (in the z-axis). The third, fourth, and fifth metal layers (112c, 112d, 112e) may include a height geometry ranging from approximately 200 µm to 800 µm.

In an aspect of the present disclosure, a third via 116c may be formed on the third metal layer 112c. A fourth via 116d may be formed on a first surface of the fourth metal layer 112d. In an aspect, a second passive component 120b may be disposed between the third and fourth metal layers (112c, 112d). The second passive component 120b may include a capacitor, such as a silicon capacitor, or a ceramic capacitor, such as a multi-layer ceramic capacitor (MLCC), a resistor, a diode, or an inductor. In an aspect, a first terminal of the second passive component 120b may be electrically coupled to the third metal layer 112c through the third via 116c. A second terminal of the second passive component 120b may be electrically coupled to the fourth metal layer 112d through the fourth via 116d. In other words, the second passive component 120b may be coupled to the third vertical voltage reference plane 112c', and may be further coupled to the fourth vertical voltage reference plane 112d' through the third and fourth vias (116c, 116d), respectively.

In an aspect of the present disclosure, a fifth via 116e may be formed on another surface of the fourth metal layer 112d. A sixth via 116f may be formed on the fifth metal layer 112e. In an aspect, a third passive component 120c may be disposed between the fourth and fifth metal layers (112d, 112e). The third passive component 120c may include a capacitor, such as a silicon capacitor, or a ceramic capacitor, such as a multi-layer ceramic capacitor (MLCC), a resistor, a diode, or an inductor. In an aspect, a first terminal of the third passive component 120c may be electrically coupled to the fourth metal layer 112d through the fifth via 116e. A second terminal of the third passive component 120e may be electrically coupled to the fifth metal layer 112e through the sixth via 116f. In other words, the third passive component 120c may be coupled to the fourth vertical voltage reference plane 112d', and may be further coupled to the fifth vertical voltage reference plane 112e' through the fifth and sixth vias (116e, 116f), respectively.

In an aspect, the third vertical voltage reference plane 112c' may be associated with a power reference voltage (Vcc). In an aspect, the fourth vertical voltage reference plane 112d' may be associated with a ground reference voltage (Vss). In an aspect, the fifth vertical voltage reference plane 112e' may be associated with a power reference voltage (Vcc). In other words, the second vertical power plane module 110b may include a vertical ground reference voltage plane (Vss) sandwiched between two vertical power reference voltage planes (Vcc).

In an aspect, the third metal layer 112c and the fifth metal layer 112e may be configured as a respective vertical power supply reference voltage (Vcc) connection between the package substrate 102 and the semiconductor device 122. The respective power supply reference voltage (Vcc) may be approximately between 0.8 volt (V) and 3.3 V. For example, the third vertical voltage reference plane (Vcc) may be approximately 0.8 V, and the fifth vertical voltage reference plane (Vcc) may be approximately 1.0 V.

In an aspect of the present disclosure, a plurality of micro bumps 117 may be disposed on the base die 108. In an aspect, a plurality of micro bumps 117a may be disposed on the first power plane module 110a. In an aspect, a plurality of micro bumps 117b may be disposed on the second power plane module 110b. The plurality of micro bumps 117a may provide an electrical connection between the first power plane module 110a, and the second chiplet 124b. The plurality of micro bumps 117 may also provide an electrical connection between the base die 108, and the first chiplet 124a. The plurality of micro bumps 117b may further provide an electrical connection between the second power plane module 110b, and the third chiplet 124c.

In an aspect of the present disclosure, a width of the plurality of micro bumps (117a, 117b) on the first and second power plane modules (110a, 110b) may be smaller than the width of the respective plurality of package bumps (106a, 106b). In an aspect, the respective chiplet side contact pads (114a, 114b, 114c, 114d, 114e) may be sized according to the width of the respective micro bumps (117a, 117b) on the first and second power plane modules (110a, 110b). In an aspect, the respective package side contact pads (115a, 115b, 115c, 115d, 115e) may be sized according to the width of the respective package bumps (106a, 106b) of the first and second power plane modules (110a, 110b).

In an aspect of the present disclosure, the first chiplet 124a, second chiplet 124b, and third chiplet 124c may communicate with one another through a redistribution layer (RDL) 119 within the base die 108. In an aspect, the RDL 119 may include a plurality of conductive traces interleaving with a plurality of dielectric layers. In an aspect, the RDL 119 may be coupled to the TSV 118 within the base die 108.

Figure 1B:
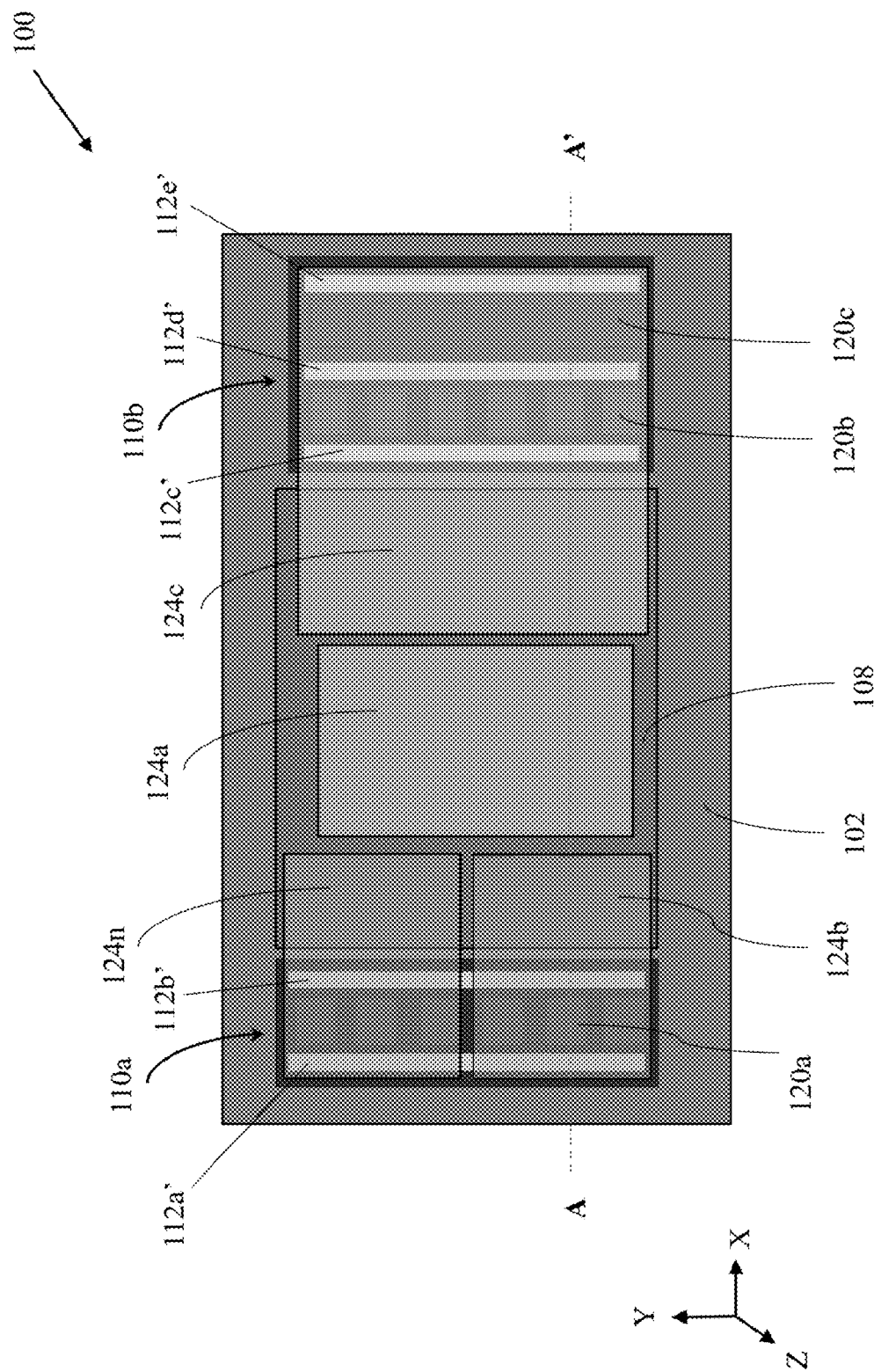
FIG. 1B shows a top view layout of the semiconductor package according to the aspect as shown in FIG. 1A.

FIG. 1B shows a top view layout of the semiconductor package 100 according to the aspect as shown in FIG. 1A. The package substrate 102 may include a perimeter or footprint. The base die 108 may include a footprint. The first chiplet 124a may include a footprint. The second chiplet 124b may include a footprint. The third chiplet 124c may include a footprint. The first power plane module 110a may include a footprint. The second power plane module 110b may include a footprint. In one aspect, the semiconductor package 100 may further include one or more additional chiplets 124n, arranged adjacent to the base die 108 and adjacent to the second chiplet 124b.

In the aspect shown in FIG. 1B, the footprints of the base die 108, first chiplet 124a, second chiplet 124b, third chiplet 124c, additional chiplet 124n, first power plane module 110a, and second power plane module 110b, fall within the perimeter of the substrate 102.

As described above, the first chiplet 124a may be disposed on the base die 108. The second chiplet 124b may be partially disposed on the base die 108 and may be partially disposed on the first power plane module 110a. The third chiplet 124c may be partially disposed on the base die 108 and may be partially disposed on the second power plane module 110b. Hence, as shown in FIG. 1B, the footprint of the first chiplet 124a may fall within the footprint of the base die 108. The footprint of the second chiplet 124b may include a portion that may overlap with the base die 108, and another portion that may overlap with the first power plane module 110a. The footprint of the third chiplet 124c may include a portion that may overlap with the base die 108, and another portion that may overlap with the second power plane module 110b. Similar to the arrangement of the second chiplet 124b, the additional chiplet 124n may include a footprint that may have a portion that may overlap with the base die 108 and another portion that may overlap with the first power plane module 110a.

The first power plane module 110a may include the first voltage reference plane 112a', and the second voltage reference plane 112b' that may align in the y-axis and may be parallel to each other. A first passive component 120a may be disposed between the first voltage reference plane 112a', and the second voltage reference plane 112b'. In the aspect shown in FIG. 1B, there may be an array of passive components disposed between the first voltage reference plane 112a', and the second voltage reference plane 112b'.

The second power plane module 110b may include the third voltage reference plane 112c', the fourth voltage reference plane 112d', and the fifth voltage reference plane 112e' that may align in the y-axis and may be parallel to one another. A second passive component 120b may be disposed between the third voltage reference plane 112c', and the fourth voltage reference plane 112d'. A third passive component 120c may be disposed between the fourth voltage reference plane 112d', and the fifth voltage reference plane 112e'. In the aspect shown in FIG. 1B, there may be an array of passive components disposed between the third voltage reference plane 112c', and the fourth voltage reference plane 112d'. In a further aspect, there may be an array of passive components disposed between the fourth voltage reference plane 112d', and the fifth voltage reference plane 112e'.

Figure 2A:
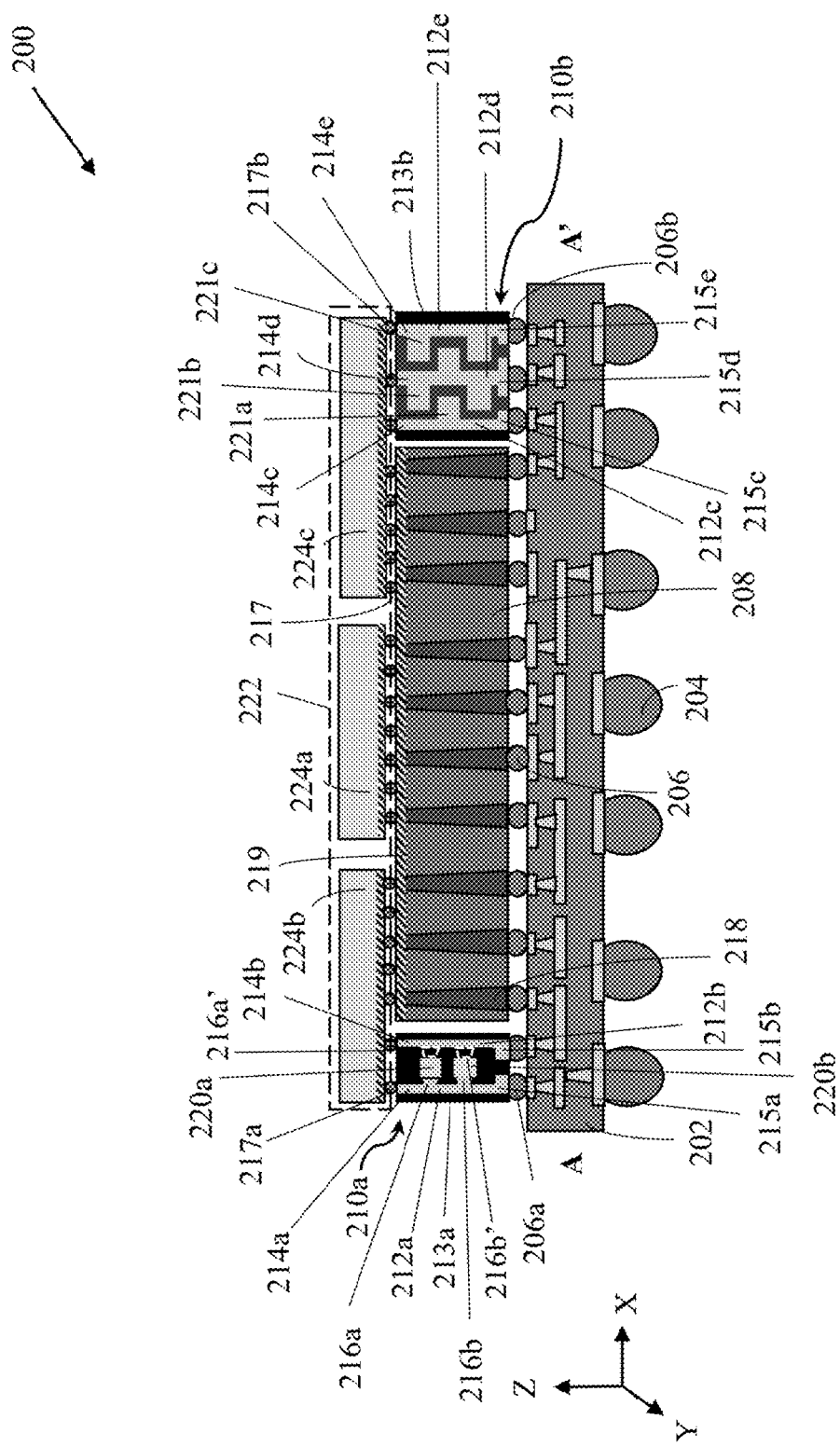
FIG. 2A shows a cross-sectional view of a semiconductor package with a peripheral vertical power plane module, according to another aspect of the present disclosure.

FIG. 2A shows a cross-sectional view of a semiconductor package 200 according to an aspect of the present disclosure. The cross-section is taken along the A-A' line of FIG. 2B.

In the aspect shown in FIG. 2A, the semiconductor package 200 may include a package substrate 202. The package substrate 202 may include contact pads, electrical interconnects, routings, and other features, which may or may not be shown in any of the present figures and which are conventional features known to a person skilled in the art. Various couplings of the components may use conventional methods, including solder bonding, thermal compression bonding, or other metal diffusion method. The package substrate 202 may have one or more rigid core layer for improved structural stability or a coreless substrate package for a reduced form-factor. In other aspects, the package substrate 202 may be part of a larger substrate that supports additional semiconductor packages, and/or components.

In an aspect, the semiconductor package 200 may include a plurality of solder balls 204. The package substrate 202 may be connected to a motherboard (not shown) through the plurality of solder balls 204. The plurality of solder balls 204 may also provide an electrical connection between the package substrate 202, and the motherboard. In an aspect, the stacked semiconductor package 200 may include a plurality of package bumps 206 disposed on the package substrate 202. The plurality of package bumps 206 may be controlled collapse chip connection (C4) bumps.

In an aspect of the present disclosure, the semiconductor package 200 may include a base die 208. The base die 208 may be an active interposer or a passive interposer. In an aspect, the base die 208 may be disposed on the package substrate 202. In an aspect, the base die 208 may be connected to the package substrate 202 through the plurality of package bumps 206. The plurality of package bumps 206 may also provide an electrical connection between the base die 208, and the package substrate 202.

In an aspect of the present disclosure, the base die 208 may include at least one through-silicon via (TSV) 218. The plurality of package bumps 206 may provide an electrical connection between the at least one TSV 218, and the package substrate 202.

In an aspect of the present disclosure, the semiconductor package 200 may include a first power plane module 210a. In an aspect, the first power plane module 210a may be disposed on the package substrate 202. In an aspect, the first power plane module 210a may be connected to the package substrate 202 through a plurality of package bumps 206a. In an aspect, the first power plane module 210a may be disposed at a first periphery of the base die 208.

In an aspect of the present disclosure, the first power plane module 210a may include a plurality of vertical interleaving metal layers (212a, 212b) electrically coupled to the package substrate 202 at a bottom surface of the first power plane module 210a. In the aspect shown in FIG. 2A, the first power plane module 210a may include a first metal layer 212a and a second metal layer 212b, interleaved with a dielectric layer. In an aspect, the first power plane module 210a may include a first mold portion 213a. The first mold portion 213a may include a molding material, such as epoxy resin polymer, silicone polymer, or polyimide material. The first mold portion 213a may have a first mold surface coupled to the package substrate 202. The first mold portion 213a may have a second mold surface coupled to a semiconductor device 222. In an aspect, the first and second metal layers (212a, 212b) may be embedded in the molding material of the first mold portion 213a. The first and second metal layers (212a, 212b) may extend through the first mold surface and the second mold surface of the first mold portion 213a.

In an aspect of the present disclosure, the plurality of package bumps 206a may provide an electrical connection between the plurality of interleaving metal layers (212a, 212b) of the first power plane module 210a, and the package substrate 202.

In an aspect of the present disclosure, the semiconductor package 200 may include a second power plane module 210b. In an aspect, the second power plane module 210b may be disposed on the package substrate 202. In an aspect, the second power plane module 210b may be connected to the package substrate 202 through a plurality of package bumps 206b. In an aspect, the second power plane module 210b may be disposed at a second periphery of the base die 208.

In an aspect of the present disclosure, the second power plane module 210b may include a plurality of vertical interleaving metal layers (212c, 212d, 212e) electrically coupled to the package substrate 202 at a bottom surface of the second power plane module 210b. In the aspect shown in FIG. 2A, the second power plane module 210b may include a third metal layer 212c, a fourth metal layer 212d, and a fifth metal layer 212e, interleaved with dielectric layers. In an aspect, the second power plane module 210b may include a second mold portion 213b. The second mold portion 213b may include a molding material, such as epoxy resin polymer, silicone polymer, or polyimide material. The second mold portion 213b may have a first mold surface coupled to the package substrate 202. The second mold portion 213b may have a second mold surface coupled to a semiconductor device 222. In an aspect, the third metal layer 212c, the fourth metal layer 212d, and the fifth metal layer 212e may be embedded in the molding material of the second mold portion 213b. The third metal layer 212c, the fourth metal layer 212d, and the fifth metal layer 212e may extend through the first mold surface and the second mold surface of the second mold portion 213b.

In an aspect of the present disclosure, the plurality of package bumps 206b may provide an electrical connection between the plurality of interleaving metal layers (212c, 212d, 212e) of the second power plane module 210b, and the package substrate 202.

In an aspect of the present disclosure, the semiconductor package 200 may include the semiconductor device 222. In an aspect, the semiconductor device 222 may be made from any suitable semiconductor, such as silicon, or gallium arsenide. The semiconductor device 222 may be a semiconductor die, chip, or a set of chiplets, e.g., a system-on-chip (SOC), a central processing unit (CPU), a platform controller hub (PCH)/chipset, a memory device, a field programmable gate array (FPGA) device, or a graphic processing unit (GPU). In the aspect shown in FIG. 2A, the semiconductor device 222 may be a set of three chiplets (224a, 224b, 224c). In one aspect, the first chiplet 224a may include a CPU, the second chiplet 224b may include a PCH, and third chiplet 224c may include a GPU.

In an aspect of the present disclosure, the semiconductor device 222 may be at least partially disposed on the base die 208. The semiconductor device 222 may also be at least partially disposed on the first power plane module 210a. The semiconductor device 222 may further be at least partially disposed on the second power plane module 210b. In an aspect, the semiconductor device 222 may have a first section disposed on the base die 208. The semiconductor device 222 may have a second section disposed on the first power plane module 210a. The semiconductor device 222 may further have a third section disposed on the second power plane module 210b. In the aspect shown in FIG. 2A, the first chiplet 224a of the semiconductor device 222 may be disposed on the base die 208. The second chiplet 224b of the semiconductor device 222 may be partially disposed on the base die 208 and may be partially disposed on the first power plane module 210a. The third chiplet 224c of the semiconductor device 222 may be partially disposed on the base die 208 and may be partially disposed on the second power plane module 210b.

In an aspect of the present disclosure, at least a portion of the semiconductor device 222 may be electrically coupled to the package substrate 202 through the at least one TSV 218.

In an aspect of the present disclosure, at least a portion of the semiconductor device 222 may be electrically coupled to the package substrate 202 through the first and second metal layers (212a, 212b) at a top surface of the first power plane module 210a. In an aspect, each of the first and second metal layers (212a, 212b) may be configurable. Each of the first and second metal layers (212a, 212b) may be configured based on the power delivery requirements of the semiconductor package 200, to mitigate power delivery challenges for 2.5D and/or 3D stacked integrated circuit (IC) packaging architectures. For example, a size, width, and/or volume of each of the first and second metal layers (212a, 212b) may be configured to meet the power delivery requirements.

In an aspect of the present disclosure, the base die 208 has a cross-section in an x-z plane. In one aspect, the first and second metal layers (212a, 212b) may extend in a direction to form a respective plane (212a', 212b') that may be transverse (i.e., in a y-axis) to the cross-section of the base die 208. In the aspect shown in FIG. 2A and FIG. 2B, the first and second metal layers (212a, 212b) may extend in the y-axis along the periphery of the base die 208. In other words, the first and second metal layers (212a, 212b) may form a first conductive plane 212a', and a second conductive plane 212b', respectively, that may be transverse to the cross-section of the base die 208, thereby forming the first power plane module 210a. In an aspect, the plane formed by the first metal layer 212a may include a first voltage reference plane 212a'. The plane formed by the second metal layer 212b may include a second voltage reference plane 212b'.

In an aspect of the present disclosure, the first and second metal layers (212a, 212b) may have a same length, or different lengths (in the y-axis). The first and second metal layers (212a, 212b) may extend in the y-axis along the periphery of the base die 208 and parallel to each other. In one aspect, each of the first and second metal layers (212a, 212b) may extend from 30% to 120% of a length of the base die 208. For example, each of the first and second metal layers (212a, 212b) may include a length ranging from 5 mm to 20 mm.

In an aspect of the present disclosure, the first metal layer 212a may include a first chiplet side contact pad 214a and a first package side contact pad 215a. In an aspect, the first chiplet side contact pad 214a may be coupled to the semiconductor device 222. The first package side contact pad 215a may be coupled to the package substrate 202. Likewise, the second metal layer 212b may include a second chiplet side contact pad 214b and a second package side contact pad 215b. In an aspect, the second chiplet side contact pad 214b may be coupled to the semiconductor device 222. The second package side contact pad 215b may be coupled to the package substrate 202. In the aspect shown in FIG. 2A, each of the first and second metal layers (212a, 212b) may be arranged in a vertical orientation so that a shortest interconnect path may be formed between the second chiplet 224b, and the package substrate 202, thereby forming a first vertical power plane module 210a. In an aspect, the vertical plane formed by the first metal layer 212a may include a first vertical voltage reference plane 212a'. The vertical plane formed by the second metal layer 212b may include a second vertical voltage reference plane 212b'.

In an aspect of the present disclosure, the first chiplet side contact pad 214a, and the first package side contact pad 215a may have different widths (in the x-axis). The first chiplet side contact pad 214a may have a width of a first dimension. The first package side contact pad 215a may have a width of a second dimension. In an aspect, the second dimension may be larger than the first dimension. In other words, the first chiplet side contact pad 214a may have a smaller width than the first package side contact pad 215a. The first dimension may include a width geometry ranging from approximately 20 μm to 100 μm. The second dimension may include a width geometry at least 1.5 times larger than the first dimension.

In an aspect of the present disclosure, the second chiplet side contact pad 214b, and the second package side contact pad 215b may have different widths (in the x-axis). The second chiplet side contact pad 214b may have a width of a first dimension. The second package side contact pad 215b may have a width of a second dimension. In an aspect, the second dimension may be larger than the first dimension. In other words, the second chiplet side contact pad 214b may have a smaller width than the second package side contact pad 215b. The first dimension may include a width geometry ranging from approximately 20 μm to 100 μm. The second dimension may include a width geometry at least 1.5 times larger than the first dimension.

In an aspect of the present disclosure, the first metal layer 212a and the second metal layer 212b may have a same height (in the z-axis). The first and the second metal layers (212a, 212b) may include a height geometry ranging from approximately 200 μm to 800 μm.

In an aspect, the different dimensions of the first and second chiplet side contact pads (214a, 214b), and the first and second package side contact pads (215a, 215b) are achieved through a non-homogeneous vertical power plane thickness. In the aspect shown in FIG. 2A, a vertical stepped reference plane in an "L" shape configuration with a first plane thickness adjacent to a module chiplet side, and a second plane thickness greater than the first plane thickness adjacent to a module package side may be provided. In an aspect, similar effective volume of a conductor plane, e.g., same effective plane volume between the first plane thickness and the second plane thickness, may be achieved through configuring the ratios of the −x and −z axes between the first and second plane thicknesses.

In an aspect of the present disclosure, a first via 216a may be formed on the first metal layer 212a. A second via 216a' may be formed on the second metal layer 212b, and may be opposing to the first via 216a. A third via 216b may be formed on the first metal layer 212a. A fourth via 216b' may be formed on the second metal layer 212b, and may be opposing to the third via 216b. In an aspect, a first passive component 220a may be disposed between the first and second metal layers (212a, 212b). In an aspect, a second passive component 220b may be disposed between the first and second metal layers (212a, 212b). The first passive component 220a and the second passive component 220b may include a capacitor, such as a silicon capacitor, or a ceramic capacitor, such as a multi-layer ceramic capacitor (MLCC), a resistor, a diode, or an inductor. In an aspect, the first and second passive components (220a, 220b) may be used for improving power integrity of the semiconductor package 200. In an aspect, the body length of the first and second passive components (220a, 220b), may be arranged along the y-axis to achieve a miniaturized or a low z-profile vertical power plane module. In an aspect, a first terminal of the first passive component 220a may be electrically coupled to the first metal layer 212a through the first via 216a. A second terminal of the first passive component 220a may be electrically coupled to the second metal layer 212b through the second via 216a'. In other words, the first passive component 220a may be coupled to the first vertical voltage reference plane 212a', and may be further coupled to the second vertical voltage reference plane 212b' through the first and second vias (216a, 216a'), respectively. In an aspect, a first terminal of the second passive component 220b may be electrically coupled to the second metal layer 212b through the fourth via 216b'. A second terminal of the second passive component 220b may be electrically coupled to the first metal layer 212a through the third via 216b. In other words, the second passive component 220b may be coupled to the first vertical voltage reference plane 212a', and may be further coupled to the second vertical voltage reference plane 212b' through the third and fourth vias (216b, 216b'), respectively. This may result in AC noise reduction as the proximity of decoupling passive components to the semiconductor device 200 may reduce power supply induced jitter, which may lead to electrical performance improvements.

In an aspect, the first vertical voltage reference plane 212a' may be associated with a ground reference voltage (Vss). In an aspect, the second vertical voltage reference plane 212b' may be associated with a power reference voltage (Vcc).

In an aspect of the present disclosure, at least a portion of the semiconductor device 222 may be electrically coupled to the package substrate 202 through the third, fourth, and fifth metal layers (212c, 212d, 212e) at a top surface of the second power plane module 210b. In an aspect, each of the third, fourth, and fifth metal layers (212c, 212d, 212e) may be configurable. Each of the third, fourth, and fifth metal layers (212c, 212d, 212e) may be configured based on the power delivery requirements of the semiconductor package 200, to mitigate power delivery challenges for 2.5D and/or 3D stacked integrated circuit (IC) packaging architectures. For example, a size, width, and/or volume of each of the third, fourth, and fifth metal layers (212c, 212d, 212e) may be configured to meet the power delivery requirements.

In an aspect of the present disclosure, the base die 208 has a cross-section in an x-z plane. In one aspect, the third, fourth, and fifth metal layers (212c, 212d, 212e) may extend in a direction to form a respective plane that may be transverse (i.e., in a y-axis) to the cross-section of the base die 208. In the aspect shown in FIG. 2A and FIG. 2B, the third, fourth, and fifth metal layers (212c, 212d, 212e) may extend in the y-axis along the periphery of the base die 208. In other words, the third, fourth, and fifth metal layers (212c, 212d, 212e) may form a third conductive plane 212c', a fourth conductive plane 212d', and a fifth conductive plane 212e', respectively, that may be transverse to the cross-section of the base die 208, thereby forming the second power plane module 210b. In an aspect, the plane formed by the third metal layer 212c may include a third voltage reference plane 212c'. The plane formed by the fourth metal layer 212d may include a fourth voltage reference plane 212d'. The plane formed by the fifth metal layer 212e may include a fifth voltage reference plane 212e'.

In an aspect of the present disclosure, the third, fourth, and fifth metal layers (212c, 212d, 212e) may have a same length, or different lengths (in the y-axis). The third, fourth, and fifth metal layers (212c, 212d, 212e) may extend in the y-axis along the periphery of the base die 208 and parallel to each other. In one aspect, each of the third, fourth, and fifth metal layers (212c, 212d, 212e) may extend from 30% to 120% of a length of the base die 208. For example, each of the third, fourth, and fifth metal layers (212c, 212d, 212e) may include a length ranging from 5 mm to 20 mm.

In an aspect of the present disclosure, the third metal layer 212c may include a third chiplet side contact pad 214c and a third package side contact pad 215c. In an aspect, the third chiplet side contact pad 214c may be coupled to the semiconductor device 222. The third package side contact pad 215c may be coupled to the package substrate 202. The fourth metal layer 212d may include a fourth chiplet side contact pad 214d and a fourth package side contact pad 215d. In an aspect, the fourth chiplet side contact pad 214d may be coupled to the semiconductor device 222. The fourth package side contact pad 215d may be coupled to the package substrate 202. The fifth metal layer 212e may include a fifth chiplet side contact pad 214e and a fifth package side contact pad 215e. In an aspect, the fifth chiplet side contact pad 214e may be coupled to the semiconductor device 222. The fifth package side contact pad 215e may be coupled to the package substrate 202. In the aspect shown in FIG. 2A, each of the third, fourth, and fifth metal layers (212c, 212d, 212e) may be arranged in a vertical orientation so that a shortest interconnect path may be formed between the third chiplet 224c, and the package substrate 202, thereby forming a second vertical power plane module 210b. In an aspect, the vertical plane formed by the third metal layer 212c may include a third vertical voltage reference plane 212c'. The vertical plane formed by the fourth metal layer 212d may include a fourth vertical voltage reference plane 212d'. The vertical plane formed by the fifth metal layer 212e may include a fifth vertical voltage reference plane 212e'.

In an aspect of the present disclosure, the third chiplet side contact pad 214c, and the third package side contact pad 215c may have different widths (in the x-axis). The third chiplet side contact pad 214c may have a width of a first dimension. The third package side contact pad 215c may have a width of a second dimension. In an aspect, the second dimension may be larger than the first dimension. In other words, the third chiplet side contact pad 214c may have a smaller width than the third package side contact pad 215c. The first dimension may include a width geometry ranging from approximately 20 µm to 100 µm. The second dimension may include a width geometry at least 1.5 times larger than the first dimension.

In an aspect of the present disclosure, the fourth chiplet side contact pad 214d, and the fourth package side contact pad 215d may have different widths (in the x-axis). The fourth chiplet side contact pad 214d may have a width of a first dimension. The fourth package side contact pad 215d may have a width of a second dimension. In an aspect, the second dimension may be larger than the first dimension. In other words, the fourth chiplet side contact pad 214d may have a smaller width than the fourth package side contact pad 215d. The first dimension may include a width geometry ranging from approximately 20 µm to 100 µm. The second dimension may include a width geometry at least 1.5 times larger than the first dimension.

In an aspect of the present disclosure, the fifth chiplet side contact pad 214e, and the fifth package side contact pad 215e may have different widths (in the x-axis). The fifth chiplet side contact pad 214e may have a width of a first dimension. The fifth package side contact pad 215e may have a width of a second dimension. In an aspect, the second dimension may be larger than the first dimension. In other words, the fifth chiplet side contact pad 214e may have a smaller width than the fifth package side contact pad 215e. The first dimension may include a width geometry ranging from approximately 20 µm to 100 µm. The second dimension may include a width geometry at least 1.5 times larger than the first dimension.

In an aspect of the present disclosure, the third, fourth, and fifth metal layers (212c, 212d, 212e) may have a same height (in the z-axis). The third, fourth, and fifth metal layers (2112c, 212d, 212e) may include a height geometry ranging from approximately 200 µm to 800 µm.

In an aspect of the present disclosure, the second power plane module 210b may not include a passive component. In one aspect, the second power plane module 210b may include at least one trench 221a (i.e., a raised section) formed on the third metal layer 212c. The trench 221a may extend from the third metal layer 212c towards the fourth metal layer 212d. The second power plane module 210b may further include at least one trench 221c formed on the fifth metal layer 212e. The trench 221c may extend from the fifth metal layer 212e towards the fourth metal layer 212d. The second power plane module 210b may yet further include at least one trench 221b formed on a first surface, and a second surface of the fourth metal layer 212d. The trench 221b may extend from the first surface of the fourth metal layer 212d towards the third metal layer 212c. The trench 221b may extend from the second surface of the fourth metal layer 212d towards the fifth metal layer 212e. The trenches (221a, 221b, 221c) of the second power plane module 210b may form an interdigital arrangement among trenches of adjacent metal layers (212c, 212d, 212e). The trenches (221a, 221b, 221c) may be isolated from one another by a dielectric layer, e.g., a polymer dry film resist (DFR). An advantage of providing such an interdigital arrangement may include a reduced inductance loop between the power and ground planes.

In an aspect, the third vertical voltage reference plane 212c' may be associated with a power reference voltage (Vcc). In an aspect, the fourth vertical voltage reference plane 212d' may be associated with a ground reference voltage (Vss). In an aspect, the fifth vertical voltage reference plane 212e' may be associated with a power reference voltage (Vcc). In other words, the second vertical power plane module 210b may include a vertical ground reference voltage plane (Vss) sandwiched between two vertical power reference voltage planes (Vcc).

In an aspect, the third metal layer 212c and the fifth metal layer 212e may be configured as a respective vertical power supply reference voltage (Vcc) connection between the package substrate 202 and the semiconductor device 222. The respective power supply reference voltage (Vcc) may be approximately between 0.8 volt (V) and 3.3 V. For example, the third vertical voltage reference plane (Vcc) may be approximately 0.8 V, and the fifth vertical voltage reference plane (Vcc) may be approximately 1.0 V.

In an aspect of the present disclosure, a plurality of micro bumps 217 may be disposed on the base die 208. In an aspect, a plurality of micro bumps 217a may be disposed on the first power plane module 210a. In an aspect, a plurality of micro bumps 217b may be disposed on the second power plane module 210b. The plurality of micro bumps 217a may provide an electrical connection between the first power plane module 210a, and the second chiplet 224b. The plurality of micro bumps 217 may also provide an electrical connection between the base die 208, and the first chiplet 224a. The plurality of micro bumps 217b may further provide an electrical connection between the second power plane module 210b, and the third chiplet 224c.

In an aspect of the present disclosure, a width of the plurality of micro bumps (217a, 217b) on the first and second power plane modules (210a, 210b) may be smaller than the width of the respective plurality of package bumps (206a, 206b). In an aspect, the respective chiplet side contact pads (214a, 214b, 214c, 214d, 214e) may be sized according to the width of the respective micro bumps (217a, 217b) on the first and second power plane modules (210a, 210b). In an aspect, the respective package side contact pads (215a, 215b, 215c, 215d, 215e) may be sized according to the width of the respective package bumps (206a, 206b) of the first and second power plane modules (210a, 210b).

In an aspect of the present disclosure, the first chiplet 224a, second chiplet 224b, and third chiplet 224c may communicate with one another through a redistribution layer (RDL) 219 within the base die 208. In an aspect, the RDL 219 may include a plurality of conductive traces interleaving with a plurality of dielectric layers. In an aspect, the RDL 219 may be coupled to the TSV 218 within the base die 208.

Figure 2B:
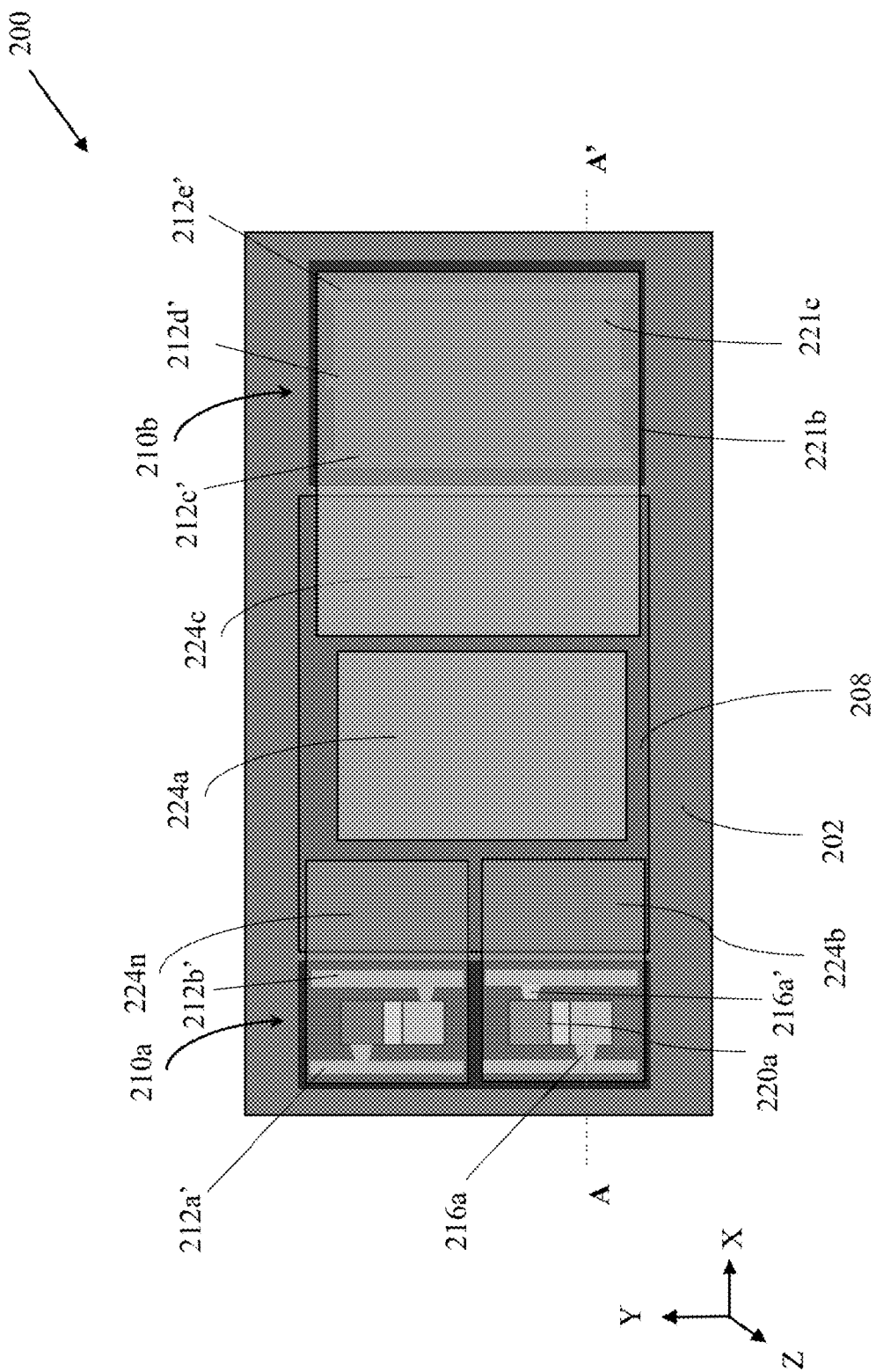
FIG. 2B shows a top view layout of the semiconductor package according to the aspect as shown in FIG. 2A.

FIG. 2B shows a top view layout of the semiconductor package 200 according to the aspect as shown in FIG. 2A. The package substrate 202 may include a perimeter or footprint. The base die 208 may include a footprint. The first chiplet 224a may include a footprint. The second chiplet 224b may include a footprint. The third chiplet 224c may include a footprint. The first power plane module 210a may include a footprint. The second power plane module 210b may include a footprint. In one aspect, the semiconductor package 200 may further include one or more additional chiplets 224n arranged adjacent to the base die 208 and adjacent to the second chiplet 224b.

In the aspect shown in FIG. 2B, the footprints of the base die 208, first chiplet 224a, second chiplet 224b, third chiplet 224c, additional chiplet 224n, first power plane module 210a, and second power plane module 210b, fall within the perimeter of the substrate 202.

As described above, the first chiplet 224a may be disposed on the base die 208. The second chiplet 224b may be partially disposed on the base die 208 and may be partially disposed on the first power plane module 210a. The third chiplet 224c may be partially disposed on the base die 208 and may be partially disposed on the second power plane module 210b. Hence, as shown in FIG. 2B, the footprint of the first chiplet 224a may fall within the footprint of the base die 208. The footprint of the second chiplet 224b may include a portion that may overlap with the base die 208, and another portion that may overlap with the first power plane module 210a. The footprint of the third chiplet 224c may include a portion that may overlap with the base die 208, and another portion that may overlap with the second power plane module 210b. Similar to the arrangement of the second chiplet 224b, the additional chiplet 224n may include a footprint that may have a portion that may overlap with the base die 208 and another portion that may overlap with the first power plane module 210a.

The first power plane module 210a may include the first voltage reference plane 212a', and the second voltage reference plane 212b' that may align in the y-axis and may be parallel to each other. A first passive component 220a may be disposed between the first voltage reference plane 212a', and the second voltage reference plane 212b'. The first passive component 220a may be coupled to the first voltage reference plane 212a' through the first via 216a. The first passive component 220a may be further coupled to the second voltage reference plane 212b' through the second via 216a'. In the aspect shown in FIG. 2B, there may be an array of passive components disposed between the first voltage reference plane 212a', and the second voltage reference plane 212b'. The body length of the first passive component 220a may be arranged along the y-axis.

The second power plane module 210b may include the third voltage reference plane 212c', the fourth voltage reference plane 212d', and the fifth voltage reference plane 212e' that may align in the y-axis and may be parallel to one another. Trenches (221b, 221c) may be arranged between adjacent voltage reference planes (212c', 212d' 212e').

Figure 3:
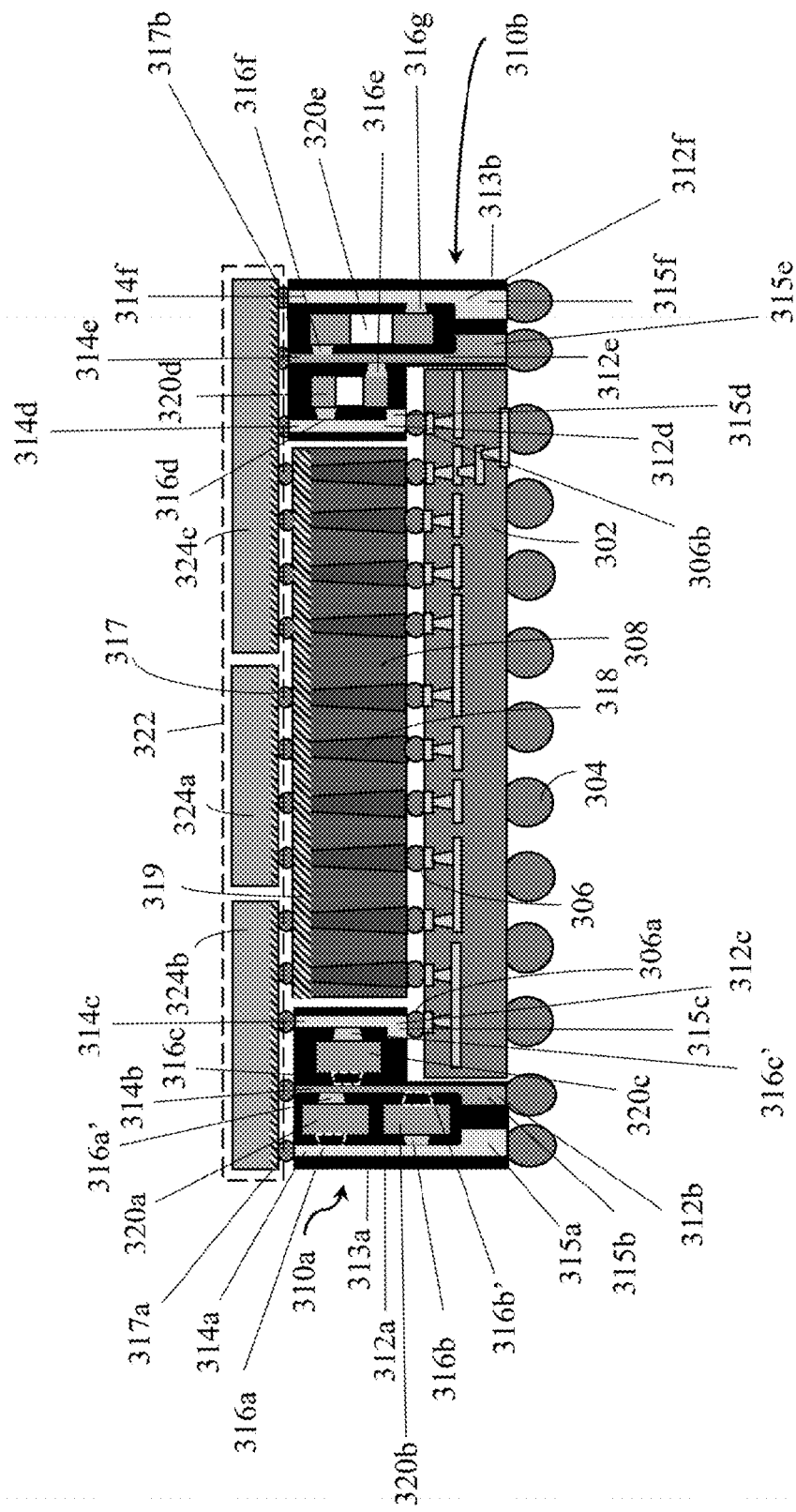
FIG. 3 shows a cross-sectional view of a semiconductor package with a peripheral vertical power plane module, according to a further aspect of the present disclosure.

FIG. 3 shows a cross-sectional view of a semiconductor package 300 according to yet another aspect of the present disclosure. The semiconductor package 300 may be similar to the semiconductor package 100 of FIG. 1A, and the semiconductor package 200 of FIG. 2A, and may include additional variations and components as described below.

In the aspect shown in FIG. 3, the semiconductor package 300 may include a package substrate 302. The package substrate 302 may include contact pads, electrical interconnects, routings, and other features, which may or may not be shown in any of the present figures and which are conventional features known to a person skilled in the art. Various couplings of the components may use conventional methods, including solder bonding, thermal compression bonding, or other metal diffusion method. The package substrate 302 may have one or more rigid core layer for improved structural stability or a coreless substrate package for a reduced form-factor. In other aspects, the package substrate 302 may be part of a larger substrate that supports additional semiconductor packages, and/or components.

In an aspect, the semiconductor package 300 may include a plurality of solder balls 304. The package substrate 302 may be connected to a motherboard (not shown) through the plurality of solder balls 304. The plurality of solder balls 304 may also provide an electrical connection between the package substrate 302, and the motherboard. In an aspect, the stacked semiconductor package 300 may include a plurality of package bumps 306 disposed on the package substrate 302. The plurality of package bumps 306 may be controlled collapse chip connection (C4) bumps.

In an aspect of the present disclosure, the semiconductor package 300 may include a base die 308. The base die 308 may be an active interposer or a passive interposer. In an aspect, the base die 308 may be disposed on the package substrate 302. In an aspect, the base die 308 may be connected to the package substrate 302 through the plurality of package bumps 306. The plurality of package bumps 306 may also provide an electrical connection between the base die 308, and the package substrate 302.

In an aspect of the present disclosure, the base die 308 may include at least one through-silicon via (TSV) 318. The plurality of package bumps 306 may provide an electrical connection between the at least one TSV 318, and the package substrate 302.

In an aspect of the present disclosure, the semiconductor package 300 may include a first power plane module 310a. In an aspect, the first power plane module 310a may include a first section disposed on the package substrate 302. In an aspect, the first power plane module 310a may be connected to the package substrate 302 through a plurality of package bumps 306a. In an aspect, the first power plane module 310a may further include a second section disposed on the motherboard (not shown). The first power plane module 310a may be connected to the motherboard through a plurality of solder balls 304. In an aspect, the first power plane module 310a may be disposed at a first periphery of the base die 308.

In an aspect of the present disclosure, the first power plane module 310a may include a plurality of vertical interleaving metal layers (312a, 312b, 312c) electrically coupled to the package substrate 302, and the motherboard. In the aspect shown in FIG. 3, the first power plane module 310a may include a first metal layer 312a, a second metal layer 312b, and a third metal layer 312c, interleaved with dielectric layers. In an aspect, the first power plane module 310a may include a first mold portion 313a. The first mold portion 313a may include a molding material, such as epoxy resin polymer, silicone polymer, or polyimide material. The first mold portion 313a may have a first mold surface coupled to the package substrate 302. The first mold portion 313a may have a second mold surface coupled to a semiconductor device 322. The first mold portion 313a may have a third mold surface coupled to the motherboard. In an aspect, the first, second, and third metal layers (312a, 312b, 312c) may be embedded in the molding material of the first mold portion 313a. The first and second metal layers (312a, 312b) may extend through the third mold surface and the second mold surface of the first mold portion 313a. The third metal layer 312c may extend through the first mold surface and the second mold surface of the first mold portion 313a.

In an aspect of the present disclosure, the plurality of package bumps 306a may provide an electrical connection between the third metal layer 312c of the first power plane module 310a, and the package substrate 302.

In an aspect of the present disclosure, the plurality of solder balls 304 may provide an electrical connection between the first and second metal layers (312a, 312b) of the first power plane module 310a, and the motherboard.

In an aspect of the present disclosure, the semiconductor package 300 may include a second power plane module 310b. In an aspect, the second power plane module 310b may include a first section disposed on the package substrate 302. In an aspect, the second power plane module 310b may be connected to the package substrate 302 through a plurality of package bumps 306b. In an aspect, the second power plane module 310b may further include a second section disposed on the motherboard (not shown). The second power plane module 310b may be connected to the motherboard through a plurality of solder balls 304. In an aspect, the second power plane module 310b may be disposed at a second periphery of the base die 308.

In an aspect of the present disclosure, the second power plane module 310b may include a plurality of vertical interleaving metal layers (312d, 312e, 312f) electrically coupled to the package substrate 302, and the motherboard. In the aspect shown in FIG. 3, the second power plane module 310b may include a fourth metal layer 312d, a fifth metal layer 312e, and a sixth metal layer 312f, interleaved with dielectric layers. In an aspect, the second power plane module 310b may include a second mold portion 313b. The second mold portion 313b may include a molding material, such as epoxy resin polymer, silicone polymer, or polyimide material. The second mold portion 313b may have a first mold surface coupled to the package substrate 302. The second mold portion 313b may have a second mold surface coupled to a semiconductor device 322. The second mold portion 313b may have a third mold surface coupled to the motherboard. In an aspect, the fourth, fifth, and sixth metal layers (312d, 312e, 312f) may be embedded in the molding material of the second mold portion 313b. The fourth metal layer 312d may extend through the first mold surface and the second mold surface of the second mold portion 313b. The fifth and sixth metal layers (312e, 312f) may extend through the second mold surface and the third mold surface of the second mold portion 313b.

In an aspect of the present disclosure, the plurality of package bumps 306b may provide an electrical connection between the fourth metal layer 312d of the second power plane module 310b, and the package substrate 302.

In an aspect of the present disclosure, the plurality of solder balls 304 may provide an electrical connection between the fifth and sixth metal layers (312e, 312f) of the second power plane module 310b, and the motherboard.

In an aspect of the present disclosure, the semiconductor package 300 may include the semiconductor device 322. In an aspect, the semiconductor device 322 may be made from any suitable semiconductor, such as silicon, or gallium arsenide. The semiconductor device 322 may be a semiconductor die, chip, or a set of chiplets, e.g., a system-on-chip (SOC), a central processing unit (CPU), a platform controller hub (PCH)/chipset, a memory device, a field programmable gate array (FPGA) device, or a graphic processing unit (GPU). In the aspect shown in FIG. 3, the semiconductor device 322 may be a set of three chiplets (324a, 324b, 324c). In one aspect, the first chiplet 324a may include a CPU, the second chiplet 324b may include a PCH, and third chiplet 324c may include a GPU.

In an aspect of the present disclosure, the semiconductor device 322 may be at least partially disposed on the base die 308. The semiconductor device 322 may also be at least partially disposed on the first power plane module 310a. The semiconductor device 322 may further be at least partially disposed on the second power plane module 310b. In an aspect, the semiconductor device 322 may have a first section disposed on the base die 308. The semiconductor device 322 may have a second section disposed on the first power plane module 310a. The semiconductor device 322 may further have a third section disposed on the second power plane module 310b. In the aspect shown in FIG. 3, the first chiplet 324a of the semiconductor device 322 may be disposed on the base die 308. The second chiplet 324b of the semiconductor device 322 may be partially disposed on the base die 308 and may be partially disposed on the first power plane module 310a. The third chiplet 324c of the semiconductor device 322 may be partially disposed on the base die 308 and may be partially disposed on the second power plane module 310b.

In an aspect of the present disclosure, at least a portion of the semiconductor device 322 may be electrically coupled to the package substrate 302 through the at least one TSV 318.

In an aspect of the present disclosure, at least a portion of the semiconductor device 322 may be electrically coupled to the motherboard through the first and second metal layers (312a, 312b), and at least another portion of the semiconductor device 322 may be electrically coupled to the package substrate 302 through the third metal layer 312c. In an aspect, each of the first, second, and third metal layers (312a, 312b, 312c) may be configurable. Each of the first, second, and third metal layers (312a, 312b, 312c) may be configured based on the power delivery requirements of the semiconductor package 300, to mitigate power delivery challenges for 2.5D and/or 3D stacked integrated circuit (IC) packaging architectures. For example, a size, width, and/or volume of each of the first, second, and third metal layers (312a, 312b, 312c) may be configured to meet the power delivery requirements.

In an aspect of the present disclosure, the base die 308 has a cross-section in an x-z plane. In one aspect, the first, second, and third metal layers (312a, 312b, 312c) may extend in a direction to form a respective plane that may be transverse (i.e., in a y-axis) to the cross-section of the base die 308. In the aspect shown in FIG. 3, the first, second, and third metal layers (312a, 312b, 312c) may extend in the y-axis along the periphery of the base die 308. In other words, the first, second, and third metal layers (312a, 312b, 312c) may form a first conductive plane, a second conductive plane, and a third conductive plane, respectively, that may be transverse to the cross-section of the base die 308, thereby forming the first power plane module 310a. In an aspect, the plane formed by the first metal layer 312a may include a first voltage reference plane. The plane formed by the second metal layer 312b may include a second voltage reference plane. The plane formed by the third metal layer 312c may include a third voltage reference plane.

In an aspect of the present disclosure, the first, second, and third metal layers (312a, 312b, 312c) may have a same length, or different lengths (in the y-axis). The first, second, and third metal layers (312a, 312b, 312c) may extend in the y-axis along the periphery of the base die 308 and parallel to one another. In one aspect, each of the first, second, and third metal layers (312a, 312b, 312c) may extend from 30% to 120% of a length of the base die 308. For example, each of the first, second, and third metal layers (312a, 312b, 312c) may include a length ranging from 5 mm to 20 mm.

In an aspect of the present disclosure, the first metal layer 312a may include a first chiplet side contact pad 314a and a first motherboard side contact pad 315a. In an aspect, the first chiplet side contact pad 314a may be coupled to the semiconductor device 322. The first motherboard side contact pad 315a may be coupled to the motherboard. Likewise, the second metal layer 312b may include a second chiplet side contact pad 314b and a second motherboard side contact pad 315b. In an aspect, the second chiplet side contact pad 314b may be coupled to the semiconductor device 322. The second motherboard side contact pad 315b may be coupled to the motherboard. The third metal layer 312c may include a third chiplet side contact pad 314c and a third package side contact pad 315c. In an aspect, the third chiplet side contact pad 314c may be coupled to the semiconductor device 322. The third package side contact pad 315c may be coupled to the package substrate 302. In the aspect shown in FIG. 3, each of the first, second, and third metal layers (312a, 312b, 312c) may be arranged in a vertical orientation so that a shortest interconnect path may be formed between the second chiplet 224b, and the package substrate 302 or motherboard, thereby forming a first vertical power plane module 310a. In an aspect, the vertical plane formed by the first metal layer 312a may include a first vertical voltage reference plane. The vertical plane formed by the second metal layer 312b may include a second vertical voltage reference plane. The vertical plane formed by the third metal layer 312c may include a third vertical voltage reference plane.

An advantage of the present disclosure may include improved Imax capacity (device reliability) through a peripheral vertical power plane module. Reduced interconnect resistance may be achieved through increased interconnect volume, i.e., a vertical plane interconnect configuration between chiplets and a package substrate compared to a discrete cylindrical interconnect with constrained geometry, e.g., a through mold via (TMV) or a through silicon via (TSV), through a base die or silicon interposer.

A further advantage of arranging a peripheral power plane module extending over the package substrate, coupled directly to the motherboard, or printed circuit board, may include a shorter power delivery path between the chiplets and motherboard. In an aspect, a portion of a footprint of the second and third chiplets (324b, 324c) may extend over the footprint of both the base die 108, and the package substrate 302 to allow package substrate and base die miniaturization.

In an aspect of the present disclosure, the first chiplet side contact pad 314a, and the first motherboard side contact pad 315a may have different widths (in the x-axis). The first chiplet side contact pad 314a may have a width of a first dimension. The first motherboard side contact pad 315a may have a width of a second dimension. In an aspect, the second dimension may be larger than the first dimension. In other words, the first chiplet side contact pad 314a may have a smaller width than the first motherboard side contact pad 315a. The first dimension may include a width geometry ranging from approximately 20 μm to 100 μm. The second dimension may include a width geometry at least 2.5 times larger than the first dimension.

In an aspect of the present disclosure, the second chiplet side contact pad 314b, and the second motherboard side contact pad 315b may have different widths (in the x-axis). The second chiplet side contact pad 314b may have a width of a first dimension. The second motherboard side contact pad 315b may have a width of a second dimension. In an aspect, the second dimension may be larger than the first dimension. In other words, the second chiplet side contact pad 314b may have a smaller width than the second motherboard side contact pad 315b. The first dimension may include a width geometry ranging from approximately 20 μm to 100 μm. The second dimension may include a width geometry at least 2.5 times larger than the first dimension.

In an aspect of the present disclosure, the third chiplet side contact pad 314c, and the third package side contact pad 315c may have different widths (in the x-axis). The third chiplet side contact pad 314c may have a width of a first dimension. The third package side contact pad 315c may have a width of a second dimension. In an aspect, the second dimension may be larger than the first dimension. In other words, the third chiplet side contact pad 314c may have a smaller width than the third package side contact pad 315c. The first dimension may include a width geometry ranging from approximately 20 μm to 100 μm. The second dimension may include a width geometry at least 1.5 times larger than the first dimension.

In an aspect of the present disclosure, the first metal layer 312a and the second metal layer 312b may have a same height (in the z-axis). The first and the second metal layers (312a, 312b) may include a height geometry ranging from approximately 700 μm to 1800 μm. The third metal layer 312c may have a shorter height than the height of the first and second metal layers (312a, 312b), due to the height of the package substrate 302 and the package bumps 306a.

In an aspect of the present disclosure, a first via 316a may be formed on the first metal layer 312a. A second via 316a' may be formed on the second metal layer 312b, and may be opposing to the first via 316a. A third via 316b may be formed on the first metal layer 312a. A fourth via 316b' may be formed on the second metal layer 312b, and may be opposing to the third via 316b. A fifth via 316c may be formed on the second metal layer 312b. A sixth via 316c' may be formed on the third metal layer 312c, and may be opposing to the fifth via 316c.

In an aspect, a first passive component 320a may be disposed between the first and second metal layers (312a, 312b). In an aspect, a second passive component 320b may be disposed between the first and second metal layers (312a, 312b). In an aspect, a third passive component 320c may be disposed between the second and third metal layers (312b, 312c). The first, second, and third passive components (320a, 320b, 320c) may include a capacitor, such as a silicon capacitor, or a ceramic capacitor, such as a multi-layer ceramic capacitor (MLCC), a resistor, a diode, or an inductor. In an aspect, the first, second, and third passive components (320a, 320b, 320c) may be used for improving power integrity of the semiconductor package 300. In an aspect, the body length of the first, second, and third passive components (320a, 320b, 320c), may be arranged along the y-axis to achieve a miniaturized or a low z-profile vertical power plane module. In an aspect, a first terminal of the first passive component 320a may be electrically coupled to the first metal layer 312a through the first via 316a. A second terminal of the first passive component 320a may be electrically coupled to the second metal layer 312b through the second via 316a'. In other words, the first passive component 320a may be coupled to the first vertical voltage reference plane and may be further coupled to the second vertical voltage reference plane through the first and second vias (316a, 316a'), respectively. In an aspect, a first terminal of the second passive component 320b may be electrically coupled to the second metal layer 312b through the fourth via 316b'. A second terminal of the second passive component 320b may be electrically coupled to the first metal layer 312a through the third via 316b. In other words, the second passive component 320b may be coupled to the first vertical voltage reference plane and may be further coupled to the second vertical voltage reference plane through the third and fourth vias (316b, 316b'), respectively. In an aspect, a first terminal of the third passive component 320c may be electrically coupled to the second metal layer 312b through the fifth via 316c. A second terminal of the third passive component 320c may be electrically coupled to the third metal layer 312c through the sixth via 316c'. In other words, the third passive component 320c may be coupled to the second vertical voltage reference plane, and may be further coupled to the third vertical voltage reference plane through the fifth and sixth vias (316c, 316c'), respectively. This may result in AC noise reduction as the proximity of decoupling passive components to the semiconductor device 300 may reduce power supply induced jitter, which may lead to electrical performance improvements.

In an aspect, the first vertical voltage reference plane may be associated with a ground reference voltage (Vss). In an aspect, the second vertical voltage reference plane may be associated with a power reference voltage (Vcc). In an aspect, the third vertical voltage reference plane may be associated with a ground reference voltage (Vss).

In an aspect of the present disclosure, at least a portion of the semiconductor device 322 may be electrically coupled to the motherboard through the fifth and sixth metal layers (312e, 312f), and at least another portion of the semiconductor device 322 may be electrically coupled to the package substrate 302 through the fourth metal layer 312d. In an aspect, each of the fourth, fifth, and sixth metal layers (312d, 312e, 312f) may be configurable. Each of the fourth, fifth, and sixth metal layers (312d, 312e, 312f) may be configured based on the power delivery requirements of the semiconductor package 300, to mitigate power delivery challenges for 2.5D and/or 3D stacked integrated circuit (IC) packaging architectures. For example, a size, width, and/or volume of each of the fourth, fifth, and sixth metal layers (312d, 312e, 312f) may be configured to meet the power delivery requirements.

In an aspect of the present disclosure, the base die 308 has a cross-section in an x-z plane. In one aspect, the fourth, fifth, and sixth metal layers (312d, 312e, 312f) may extend in a direction to form a respective plane that may be transverse (i.e., in a y-axis) to the cross-section of the base die 308. In the aspect shown in FIG. 3, the fourth, fifth, and sixth metal layers (312d, 312e, 312f) may extend in the y-axis along the periphery of the base die 308. In other words, the fourth, fifth, and sixth metal layers (312d, 312e, 312f) may form a fourth conductive plane, a fifth conductive plane, and a sixth conductive plane, respectively, that may be transverse to the cross-section of the base die 308, thereby forming the second power plane module 310b. In an aspect, the plane formed by the fourth metal layer 312d may include a fourth voltage reference plane. The plane formed by the fifth metal layer 312e may include a fifth voltage reference plane. The plane formed by the sixth metal layer 312f may include a sixth voltage reference plane.

In an aspect of the present disclosure, the fourth, fifth, and sixth metal layers (312d, 312e, 312f) may have a same length, or different lengths (in the y-axis). The fourth, fifth, and sixth metal layers (312d, 312e, 312f) may extend in the y-axis along the periphery of the base die 308 and parallel to one another. In one aspect, each of the fourth, fifth, and sixth metal layers (312d, 312e, 312f) may extend from 30% to 120% of a length of the base die 308. For example, each of the fourth, fifth, and sixth metal layers (312d, 312e, 312f) may include a length ranging from 5 mm to 20 mm.

In an aspect of the present disclosure, the fourth metal layer 312d may include a fourth chiplet side contact pad 314d and a fourth package side contact pad 315d. In an aspect, the fourth chiplet side contact pad 314d may be coupled to the semiconductor device 322. The fourth package side contact pad 315d may be coupled to the package substrate 302. The fifth metal layer 312e may include a fifth chiplet side contact pad 314e and a fifth motherboard side contact pad 315e. In an aspect, the fifth chiplet side contact pad 314e may be coupled to the semiconductor device 322. The fifth motherboard side contact pad 315e may be coupled to the motherboard. The sixth metal layer 312f may include a sixth chiplet side contact pad 314f and a sixth motherboard side contact pad 315f. In an aspect, the sixth chiplet side contact pad 314f may be coupled to the semiconductor device 322. The sixth motherboard side contact pad 315f may be coupled to the motherboard. In the aspect shown in FIG. 3, each of the fourth, fifth, and sixth metal layers (312d, 312e, 312f) may be arranged in a vertical orientation so that a shortest interconnect path may be formed between the third chiplet 224c, and the package substrate 302 or motherboard, thereby forming a second vertical power plane module 310b. In an aspect, the vertical plane formed by the fourth metal layer 312d may include a fourth vertical voltage reference plane. The vertical plane formed by the fifth metal layer 312e may include a fifth vertical voltage reference plane. The vertical plane formed by the sixth metal layer 312f may include a sixth vertical voltage reference plane.

In an aspect of the present disclosure, the fourth chiplet side contact pad 314d, and the fourth package side contact pad 315d may have different widths (in the x-axis). The fourth chiplet side contact pad 314d may have a width of a first dimension. The fourth package side contact pad 315d may have a width of a second dimension. In an aspect, the second dimension may be larger than the first dimension. In other words, the fourth chiplet side contact pad 314d may have a smaller width than the fourth package side contact pad 315d. The first dimension may include a width geometry ranging from approximately 20 μm to 100 μm. The second dimension may include a width geometry at least 1.5 times larger than the first dimension.

In an aspect of the present disclosure, the fifth chiplet side contact pad 314e, and the fifth motherboard side contact pad 315e may have different widths (in the x-axis). The fifth chiplet side contact pad 314e may have a width of a first dimension. The fifth motherboard side contact pad 315e may have a width of a second dimension. In an aspect, the second dimension may be larger than the first dimension. In other words, the fifth chiplet side contact pad 314e may have a smaller width than the fifth motherboard side contact pad 315e. The first dimension may include a width geometry ranging from approximately 20 μm to 100 μm. The second dimension may include a width geometry at least 2.5 times larger than the first dimension.

In an aspect of the present disclosure, the sixth chiplet side contact pad 314f, and the sixth motherboard side contact pad 315f may have different widths (in the x-axis). The sixth chiplet side contact pad 314f may have a width of a first dimension. The sixth motherboard side contact pad 315f may have a width of a second dimension. In an aspect, the second dimension may be larger than the first dimension. In other words, the sixth chiplet side contact pad 314f may have a smaller width than the sixth motherboard side contact pad 315f. The first dimension may include a width geometry ranging from approximately 20 μm to 100 μm. The second dimension may include a width geometry at least 2.5 times larger than the first dimension.

In an aspect of the present disclosure, the fifth metal layer 312e and the sixth metal layer 312f may have a same height (in the z-axis). The fifth and the sixth metal layers (312e, 312f) may include a height geometry ranging from approximately 700 μm to 1800 μm. The fourth metal layer 312d may have a shorter height than the height of the fifth and sixth metal layers (312e, 312f), due to the height of the package substrate 302 and the package bumps 306b.

In an aspect of the present disclosure, a seventh via 316d may be formed on the fourth metal layer 312d. An eighth via 316e may be formed on a first surface of the fifth metal layer 312e. A ninth via 316f may be formed on a second surface of the fifth metal layer 312e. A tenth via 316g may be formed on the sixth metal layer 312f. In an aspect, a fourth passive component 320d may be disposed between the fourth and fifth metal layers (312d, 312e). A fifth passive component 320e may be disposed between the fifth and sixth metal layers (312e, 312f). The fourth and fifth passive components (320d, 320e) may include a capacitor, such as a silicon capacitor, or a ceramic capacitor, such as a multi-layer ceramic capacitor (MLCC), a resistor, a diode, or an inductor. In the aspect shown in FIG. 3, a body length of the fourth and fifth passive components (320d, 320e) may be arranged along the z-axis. In an aspect, a first terminal of the fourth passive component 320d may be electrically coupled to the fourth metal layer 312d through the seventh via 316d. A second terminal of the fourth passive component 320d may be electrically coupled to the fifth metal layer 312e through the eighth via 316e. In other words, the fourth passive component 320d may be coupled to the fourth vertical voltage reference plane and may be further coupled to the fifth vertical voltage reference plane through the seventh and eighth vias (316d, 316e), respectively. In an aspect, a first terminal of the fifth passive component 320e may be electrically coupled to the fifth metal layer 312e through the ninth via 316f. A second terminal of the fifth passive component 320e may be electrically coupled to the sixth metal layer 312f through the tenth via 316g. In other words, the fifth passive component 320e may be coupled to the fifth vertical voltage reference plane and may be further coupled to the sixth vertical voltage reference plane through the eighth and ninth vias (316f, 316g), respectively. This may result in AC noise reduction as the proximity of a decoupling passive component to the semiconductor device 300 may reduce power supply induced jitter, which may lead to electrical performance improvements.

In an aspect, the fourth vertical voltage reference plane may be associated with a ground reference voltage (Vss). In an aspect, the fifth vertical voltage reference plane may be associated with a power reference voltage (Vcc). In an aspect, the sixth vertical voltage reference plane may be associated with a ground reference voltage (Vss).

In an aspect of the present disclosure, a plurality of micro bumps 317 may be disposed on the base die 308. In an aspect, a plurality of micro bumps 317a may be disposed on the first power plane module 310a. In an aspect, a plurality of micro bumps 317b may be disposed on the second power plane module 310b. The plurality of micro bumps 317a may provide an electrical connection between the first power plane module 310a, and the second chiplet 324b. The plurality of micro bumps 317 may also provide an electrical connection between the base die 308, and the first chiplet 324a. The plurality of micro bumps 317b may further provide an electrical connection between the second power plane module 310b, and the third chiplet 324c.

In an aspect of the present disclosure, a width of the plurality of micro bumps (317a, 317b) on the first and second power plane modules (310a, 310b) may be smaller than the width of the respective plurality of package bumps (306a, 306b). In an aspect, the respective chiplet side contact pads (314a, 314b, 314c, 314d, 314e, 314f) may be sized according to the width of the respective micro bumps (317a, 317b) on the first and second power plane modules (310a, 310b). In an aspect, the respective package side contact pads (315c, 315d) may be sized according to the width of the respective package bumps (306a, 306b) of the first and second power plane modules (310a, 310b). In an aspect, the respective motherboard side contact pads (315a, 315b, 315e, 315f) may be sized according to the width of the respective solder balls 304 of the first and second power plane modules (310a, 310b).

In an aspect of the present disclosure, the first chiplet 324a, second chiplet 324b, and third chiplet 324c may communicate with one another through a redistribution layer (RDL) 319 within the base die 308. In an aspect, the RDL 319 may include a plurality of conductive traces interleaving with a plurality of dielectric layers. In an aspect, the RDL 319 may be coupled to the TSV 318 within the base die 308.

Figure 4A:
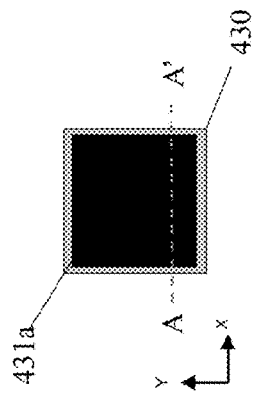
FIGS. 4A through 4P show cross-sectional and top views directed to an exemplary simplified process flow for a method for forming a semiconductor package with a peripheral vertical power plane module, according to an aspect that is generally similar to that shown in FIG. 1A of the present disclosure.
Figure 4B:
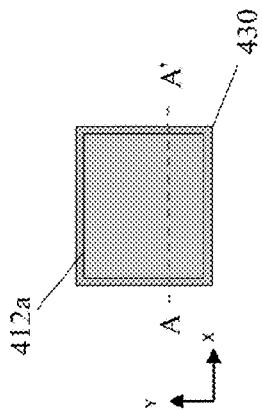
Figure 4C:
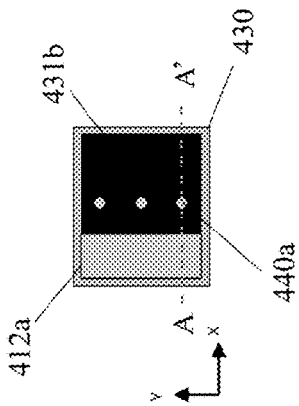
Figure 4D:
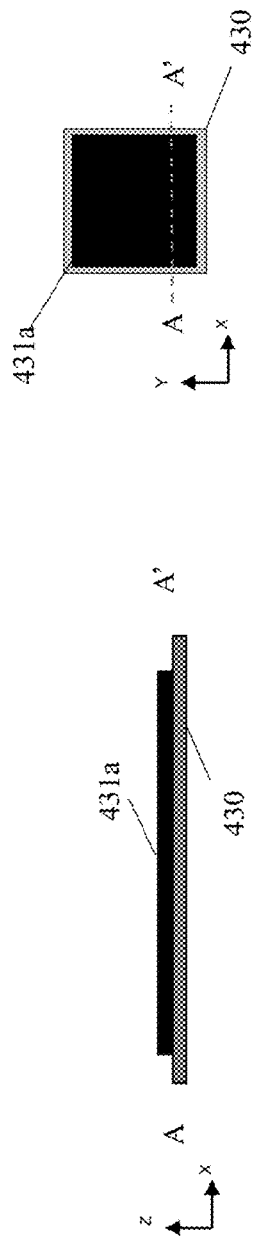
Figure 4E:
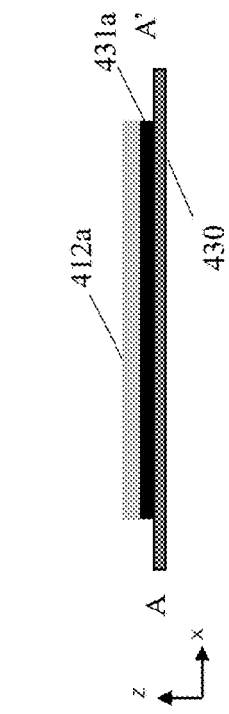
Figure 4F:
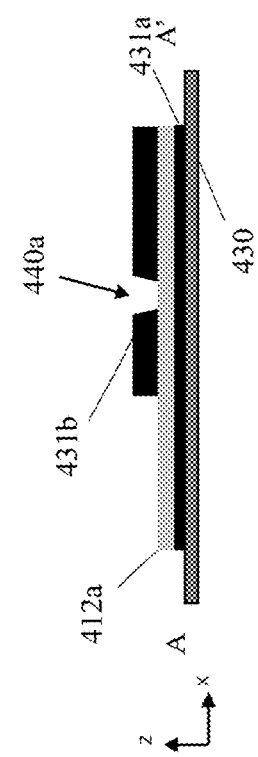
Figure 4H:
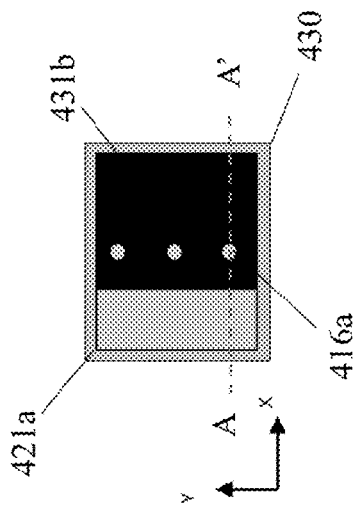
Figure 4J:
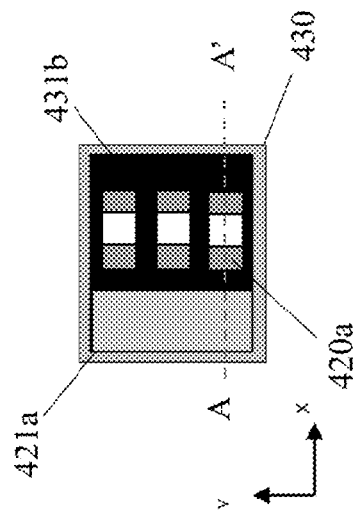
Figure 4G:
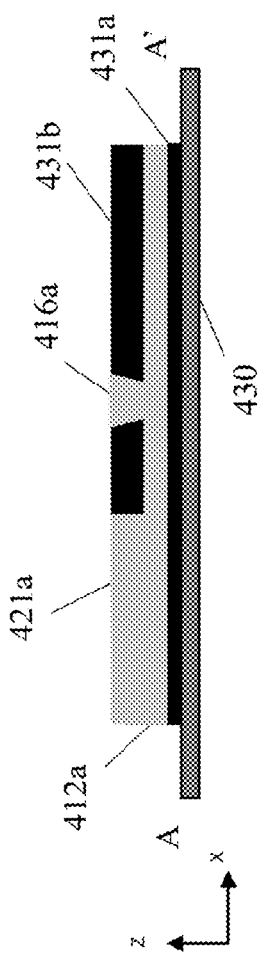
Figure 4I:
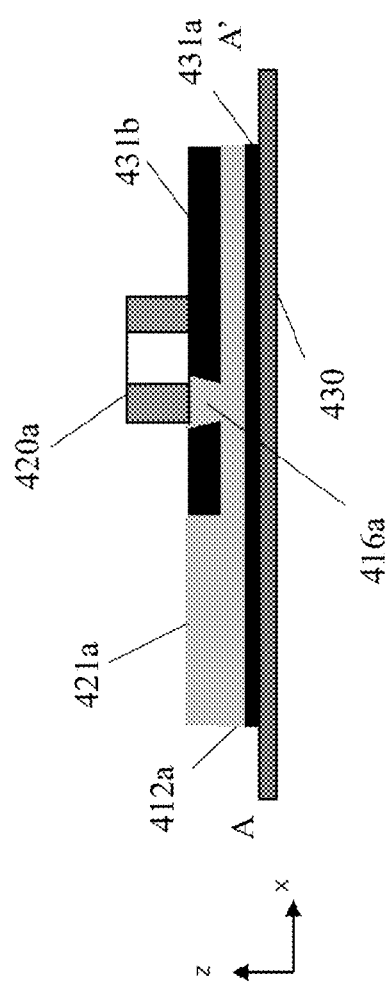
Figure 4O:
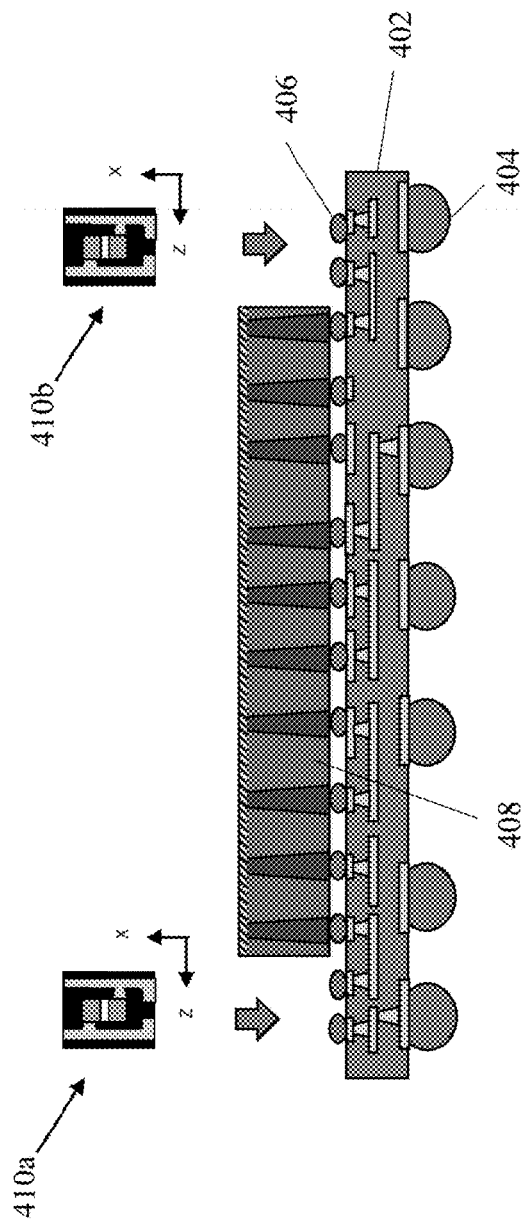
Figure 4P:
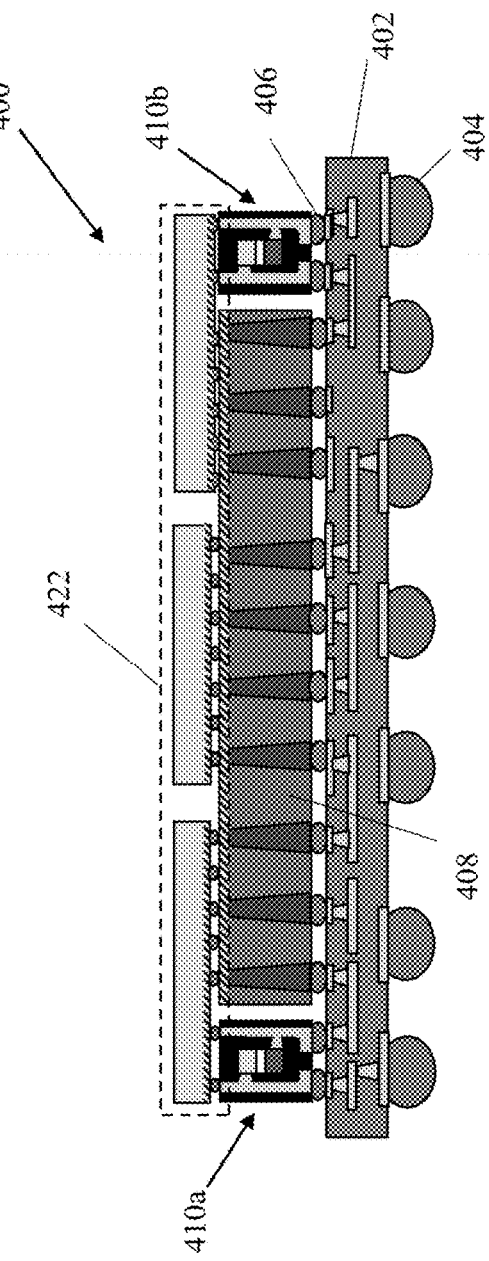

FIGS. 4A through 4P show cross-sectional and top views directed to an exemplary simplified process flow for forming a semiconductor package according to an aspect that is generally similar to that shown in FIG. 1A of the present disclosure.

FIG. 4A shows a cross-sectional view of a carrier 430 and a first mold layer 431a. The cross-section is taken along the A-A' line of FIG. 4B. The first mold layer 431a may be formed on the carrier 430 by conventional techniques, such as, but not limited to, a compression, transfer, or injection molding process.

FIG. 4B shows a top view of the carrier 430 and the first mold layer 431a formed in this operation, which may show a solid plane of the first mold layer 431a.

FIG. 4C shows a cross-sectional view of the formation of a first metal layer 412a. The cross-section is taken along the A-A' line of FIG. 4D. The first metal layer 412a may be formed on the first mold layer 431a by conventional techniques, such as, but not limited to, a lamination or plating process. In one aspect, the first metal layer 412a may be copper.

FIG. 4D shows a top view of the first metal layer 412a formed in this operation, which may show a solid plane of the first metal layer 412a.

FIG. 4E shows a cross-sectional view of the formation of a second mold layer 431b, and a first mold opening 440a in the second mold layer 431b. The cross-section is taken along the A-A' line of FIG. 4F. The second mold layer 431b may be formed on a portion of the first metal layer 412a, by conventional techniques, such as, but not limited to, a compression, injection molding, or spin coating process. In one aspect, the first mold opening 440a may be formed by laser drilling.

FIG. 4F shows a top view of the second mold layer 431b and the first mold opening 440a formed in this operation. In one aspect, a plurality of mold openings may be formed.

FIG. 4G shows a cross-sectional view of the formation of a first trench 421a and a first via 416a. The cross-section is taken along the A-A' line of FIG. 4H. The first trench 421a may be formed on a portion of the first metal layer 412a not covered by the first mold layer 431a, by conventional techniques, such as, but not limited to, an electroplating process. The first via 416a may be formed in the mold opening 440 on the first mold layer 431a by conventional techniques, such as, but not limited to, an electroplating process. In one aspect, the first trench 421a and the first via 416a may be copper.

FIG. 4H shows a top view of the second mold layer 431b, the first trench 421a, and the first via 416a formed in this operation. In one aspect, a plurality of vias may be formed.

FIG. 4I shows a cross-sectional view of the formation of a first passive component 420a. The cross-section is taken along the A-A' line of FIG. 4J. The first passive component 420a may be disposed on the second mold layer 431b. A first terminal of the first passive component 420a may be coupled to the first via 416a by conventional techniques, such as, but not limited to, a thermal compression bonding or solder reflow process.

FIG. 4J shows a top view of the first passive component 420a formed in this operation. In one aspect, a plurality of passive components may be formed.

FIG. 4K shows a cross-sectional view of the formation of a third mold layer 431c, and a second mold opening 440b in the third mold layer 431c. The cross-section is taken along the A-A' line of FIG. 4L. The third mold layer 431c may be formed on the first trench 421a and the first passive component 420a, by conventional techniques, such as, but not limited to, a compression, injection molding, or spin coating process. In one aspect, the second mold opening 440b may be formed by etching or laser drilling.

FIG. 4L shows a top view of the third mold layer 431c and the second mold opening 440b formed in this operation. A second terminal of the first passive component 420a may be exposed by the second mold opening 440b. In one aspect, a plurality of mold openings may be formed.

FIG. 4M shows a cross-sectional view of the formation of a second trench 421b and a second via 416b. The cross-section is taken along the A-A' line of FIG. 4N. The second trench 421b may be formed on a portion of the second mold layer 431b, by conventional techniques, such as, but not limited to, an electroplating process. The second via 416b may be formed in the second mold opening 440b by conventional techniques, such as, but not limited to, an electroplating process. A second metal layer 412b may then be formed on the second trench 421b, the third mold layer 431c, and the second via 416b by conventional techniques, such as, but not limited to, an electroplating and polishing process.

FIG. 4N shows a top view of a buildup panel that may include the second metal layer 412b formed in this operation, which may show a solid plane of the second metal layer 412b. A dicing process may then be carried out (not shown) to cut the panel into individual pieces of power plane modules. The dicing process may include mechanical or laser cutting.

FIG. 4O shows disposing a first power plane module 410a, and a second power plane module 410b on a package substrate 402. The first power plane module 410a, and a second power plane module 410b may first be rotated after dicing, such that the first and second metal layers (412a, 412b) may form a respective vertical voltage reference plane after disposing on the package substrate 402. The package substrate 402 may include contact pads, electrical interconnects, routings, and other features, which may or may not be shown in any of the present figures and which are conventional features known to a person skilled in the art. The package substrate may further include pre-formed solder balls 404 and package bumps 406. A base die 408 may be coupled to the package substrate 402 through the package bumps 406. The base die 408 may include pre-formed TSVs and RDL therein. The first and second power plane modules (410a, 410b) may be coupled to the package substrate through the package bumps 406 by conventional techniques, such as but not limited to, a thermal compression bonding or reflow process. The first and second power plane modules (410a, 410b) may be arranged at a periphery of the base die 408.

FIG. 4P shows the attachment of a semiconductor device 422 onto the base die 408, the first power plane module 410a, and the second power plane module 410b, by conventional techniques, such as, but not limited to, a thermal compression bonding or reflow process, to obtain a semiconductor package 400 according to one aspect of the present disclosure.

It will be understood that the exemplary process described above relating to FIGS. 4A through 4P is not limited to this particular order. Any suitable, modified order of operations may be used.

Figure 5:
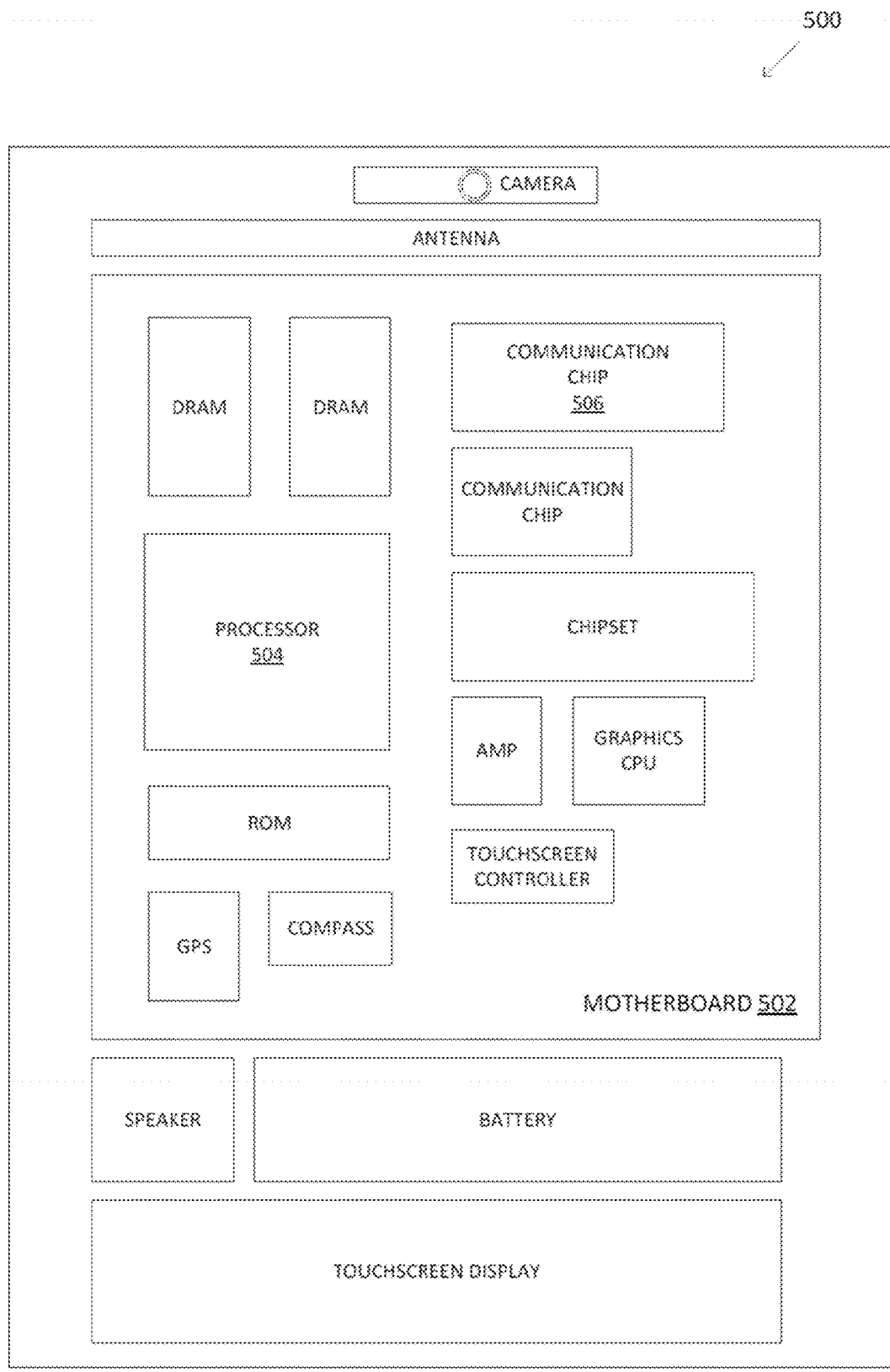
FIG. 5 shows an illustration of a computing device that includes a semiconductor package according to a further aspect of the present disclosure.

Aspects of the present disclosure may be implemented into a system using any suitable hardware and/or software. FIG. 5 schematically illustrates a computing device 500 that may include a semiconductor package as described herein, in accordance with some aspects. The computing device 500 may house a board such as a motherboard 502. The motherboard 502 may include a number of components, including but not limited to a processor 504 and at least one communication chip 506. The processor 504, which may have a semiconductor package according to the present disclosure, may be physically and electrically coupled to the motherboard 502. In some implementations, the at least one communication chip 506 may also be physically and electrically coupled to the motherboard 502. In further implementations, the communication chip 506 may be part of the processor or package 504.

Depending on its applications, computing device 500 may include other components that may or may not be physically and electrically coupled to the motherboard 502. These other components may include, but are not limited to, volatile memory (e.g. DRAM), non-volatile memory (e.g. ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In another aspect, the processor 504 of the computing device 500 may be packaged in a semiconductor package with a peripheral vertical power plane module as described herein, and/or other semiconductor devices may be packaged together in a semiconductor package with a peripheral vertical power plane module as described herein.

The communication chip 506 may enable wireless communications for the transfer of data to and from the computing device 500. The term "wireless" and its derivatives may be used to describe circuits, devices, systems, methods, techniques, communications channels, etc. that may communicate data through the use of modulated electromagnetic radiation through a non-solid medium. The term does not imply that the associated devices do not contain any wires, although in some aspects they might not. The communication chip 506 may implement any of a number of wireless standards or protocols, including but not limited to Institute for Electrical and Electronic Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 506 may also operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other aspects.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

In various implementations, the computing device 500 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In an aspect, the computing device 500 may be a mobile computing device. In further implementations, the computing device 500 may be any other electronic device that processes data.

Figure 6:
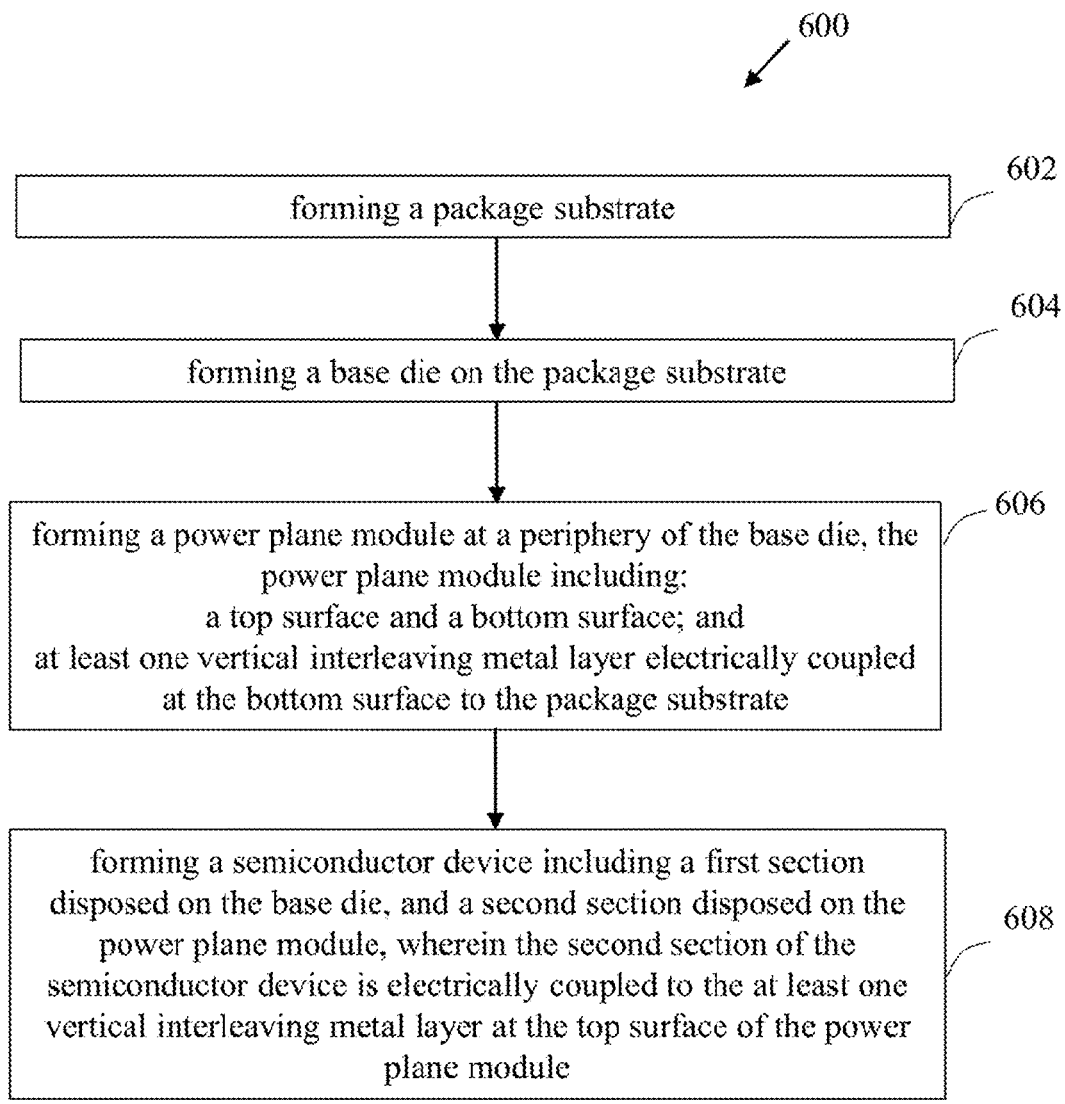
FIG. 6 shows a flow chart illustrating a method for forming a semiconductor package according to an aspect of the present disclosure.

FIG. 6 shows a flow chart illustrating a method 600 of forming a semiconductor package according to an aspect of the present disclosure.

As shown in FIG. 6, at operation 602, the method 600 of forming a semiconductor package may include forming a package substrate.

At operation 604, the method may include forming a base die on the package substrate.

At operation 606, the method may include forming a power plane module at a periphery of the base die. The power plane module may include a top surface and a bottom surface, and at least one vertical interleaving metal layer electrically coupled at the bottom surface to the package substrate.

At operation 608, the method may include forming a semiconductor device including a first section disposed on the base die, and a second section disposed on the power plane module, wherein the second section of the semiconductor device is electrically coupled to the at least one vertical interleaving metal layer at the top surface of the power plane module It will be understood that the above operations described above relating to FIG. 6 are not limited to this particular order. Any suitable, modified order of operations may be used.

Examples

Example 1 may include a semiconductor package including a package substrate, a base die on and electrically coupled to the package substrate, at least one power plane module on the package substrate at a periphery of the base die, the power plane module including a top surface and a bottom surface, and at least one vertical interleaving metal layer electrically coupled at the bottom surface to the package substrate, and a semiconductor device including a first section disposed on the base die, and a second section disposed on the power plane module, wherein the second section of the semiconductor device is electrically coupled to the at least one vertical interleaving metal layer at the top surface of the power plane module.

Example 2 may include the semiconductor package of example 1 and/or any other example disclosed herein, wherein the at least one vertical interleaving metal layer may further include a plurality of interleaving metal layers, each of the plurality of interleaving metal layers may further include a top portion coupled to the semiconductor device; and a bottom portion coupled to the package substrate, wherein the bottom portion has a larger width than a width of the top portion.

Example 3 may include the semiconductor package of example 2 and/or any other example disclosed herein, wherein the width of the bottom portion may be at least one and a half times larger than the width of the top portion.

Example 4 may include the semiconductor package of example 2 and/or any other example disclosed herein, wherein the plurality of interleaving metal layers may further include at least one ground reference voltage plane and at least one power reference voltage plane.

Example 5 may include the semiconductor package of example 2 and/or any other example disclosed herein, wherein the power plane module may further include at least one passive component.

Example 6 may include the semiconductor package of example 5 and/or any other example disclosed herein, wherein the passive component may be electrically coupled to at least one metal layer of the plurality of interleaving metal layers.

Example 7 may include the semiconductor package of example 5 and/or any other example disclosed herein, wherein the passive component may include a multi-layer ceramic capacitor and/or a silicon capacitor.

Example 8 may include the semiconductor package of example 1 and/or any other example disclosed herein, wherein the power plane module may further include a plurality of trenches on one or more of the plurality of interleaving metal layers.

Example 9 may include the semiconductor package of example 8 and/or any other example disclosed herein, wherein the plurality of trenches may be isolated by dielectric layers.

Example 10 may include the semiconductor package of example 8 and/or any other example disclosed herein, wherein the plurality of trenches may be arranged in an interdigital arrangement.

Example 11 may include the semiconductor package of example 1 and/or any other example disclosed herein, wherein the plurality of interleaving metal layers may be isolated by dielectric layers.

Example 12 may include the semiconductor package of example 1 and/or any other example disclosed herein, wherein the ground reference voltage plane and the power reference voltage plane may be parallel to each other.

Example 13 may include the semiconductor package of example 1 and/or any other example disclosed herein, wherein the power plane module may further include a first section at the periphery of the base die with a first bottom portion disposed on the package substrate, and a second section at a periphery of the package substrate with a second bottom portion disposed on a motherboard.

Example 14 may include a computing device including a circuit board, and a semiconductor package coupled to the circuit board, wherein the semiconductor package may include a package substrate, a base die on and electrically coupled to the package substrate, at least one power plane module on the package substrate at a periphery of the base die, the power plane module including a top surface and a bottom surface, and at least one vertical interleaving metal layer electrically coupled at the bottom surface to the package substrate, and a semiconductor device including a first section disposed on the base die, and a second section disposed on the power plane module, wherein the second section of the semiconductor device is electrically coupled to the at least one vertical interleaving metal layer at the top surface of the power plane module.

Example 15 may include the computing device of example 14 and/or any other example disclosed herein, wherein the at least one vertical interleaving metal layer may further include a plurality of interleaving metal layers, each of the plurality of interleaving metal layers may further include a top portion coupled to the semiconductor device; and a bottom portion coupled to the package substrate, wherein the bottom portion has a larger width than a width of the top portion.

Example 16 may include a method including forming a package substrate, forming a base die on the package substrate, forming a power plane module at a periphery of the base die, the power plane module may include a top surface and a bottom surface and at least one vertical interleaving metal layer electrically coupled at the bottom surface to the package substrate, forming a semiconductor device including a first section disposed on the base die, and a second section disposed on the power plane module, wherein the second section of the semiconductor device is electrically coupled to the at least one vertical interleaving metal layer at the top surface of the power plane module.

Example 17 may include the method of example 16 and/or any other example disclosed herein, wherein the at least one vertical interleaving metal layer may further include a plurality of interleaving metal layers, each of the plurality of interleaving metal layers may further include a top portion coupled to the semiconductor device; and a bottom portion coupled to the package substrate, wherein the bottom portion has a larger width than a width of the top portion.

Example 18 may include the method of example 16 and/or any other example disclosed herein, further including coupling at least one passive component to the plurality of interleaving metal layers.

Example 19 may include the method of example 16 and/or any other example disclosed herein, further including coupling a plurality of trenches to one or more of the plurality of interleaving metal layers.

Example 20 may include the method of example 19 and/or any other example disclosed herein, further including arranging the trenches in an interdigital arrangement.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") used herein may be understood as electrically coupled or as mechanically coupled, e.g. attached or fixed or mounted, or just in contact without any fixation, and it will be understood that both direct coupling and indirect coupling (in other words, coupling without direct contact) may be provided.

While the present disclosure has been particularly shown and described with reference to specific aspects, it should be understood by persons skilled in the art that various changes in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

What is claimed is:

1. A semiconductor package comprising:
a package substrate;
a base die on and electrically coupled to the package substrate;
at least one power plane module on the package substrate at a periphery of the base die, the power plane module comprising:
a top surface and a bottom surface; and
at least one vertical interleaving metal layer electrically coupled at the bottom surface to the package substrate; and
a semiconductor device comprising a first section disposed on the base die, and a second section disposed on the power plane module, wherein the second section of the semiconductor device is electrically coupled to the at least one vertical interleaving metal layer at the top surface of the power plane module.

2. The semiconductor package of claim 1, wherein the at least one vertical interleaving metal layer further comprises a plurality of interleaving metal layers, each of the plurality of interleaving metal layers further comprises:
a top portion coupled to the semiconductor device; and
a bottom portion coupled to the package substrate, wherein the bottom portion has a larger width than a width of the top portion.

3. The semiconductor package of claim 2, wherein the width of the bottom portion is at least one and a half times larger than the width of the top portion.

4. The semiconductor package of claim 2, wherein the plurality of interleaving metal layers further comprises at least one ground reference voltage plane and at least one power reference voltage plane.

5. The semiconductor package of claim 2, wherein the power plane module further comprises at least one passive component.

6. The semiconductor package of claim 5, wherein the passive component is electrically coupled to at least one metal layer of the plurality of interleaving metal layers.

7. The semiconductor package of claim 5, wherein the passive component comprises a multi-layer ceramic capacitor and/or a silicon capacitor.

8. The semiconductor package of claim 2, wherein the power plane module further comprises a plurality of trenches on one or more of the plurality of interleaving metal layers.

9. The semiconductor package of claim 8, wherein the plurality of trenches are isolated by dielectric layers.

10. The semiconductor package of claim 8, wherein the plurality of trenches are arranged in an interdigital arrangement.

11. The semiconductor package of claim 1, wherein the plurality of interleaving metal layers are isolated by dielectric layers.

12. The semiconductor package of claim 4, wherein the ground reference voltage plane and the power reference voltage plane are parallel to each other.

13. The semiconductor package of claim 1, wherein the power plane module further comprises a first section at the periphery of the base die with a first bottom portion disposed on the package substrate, and a second section at a periphery of the package substrate with a second bottom portion disposed on a motherboard.

14. A computing device comprising:
a circuit board; and
a semiconductor package coupled to the circuit board, wherein the semiconductor package comprises:
a package substrate;
a base die on and electrically coupled to the package substrate;
at least one power plane module on the package substrate at a periphery of the base die, the power plane module comprising:
a top surface and a bottom surface; and
at least one vertical interleaving metal layer electrically coupled at the bottom surface to the package substrate; and
a semiconductor device comprising a first section disposed on the base die, and a second section disposed on the power plane module, wherein the second section of the semiconductor device is electrically coupled to the at least one vertical interleaving metal layer at the top surface of the power plane module.

15. The computing device of claim 14,
wherein the at least one vertical interleaving metal layer further comprises a plurality of interleaving metal layers, each of the plurality of interleaving metal layers further comprises:
a top portion coupled to the semiconductor device; and
a bottom portion coupled to the package substrate, wherein the bottom portion has a larger width than a width of the top portion.

16. A method comprising:
forming a package substrate;
forming a base die on the package substrate;
forming a power plane module at a periphery of the base die, the power plane module comprising:
a top surface and a bottom surface; and
at least one vertical interleaving metal layer electrically coupled at the bottom surface to the package substrate;
forming a semiconductor device comprising a first section disposed on the base die, and a second section disposed on the power plane module, wherein the second section of the semiconductor device is electrically coupled to the at least one vertical interleaving metal layer at the top surface of the power plane module.

17. The method of claim 16,
wherein the at least one vertical interleaving metal layer further comprises a plurality of interleaving metal layers, each of the plurality of interleaving metal layers further comprises:
a top portion coupled to the semiconductor device; and
a bottom portion coupled to the package substrate, wherein the bottom portion has a larger width than a width of the top portion.

18. The method of claim 17, further comprising coupling at least one passive component to the plurality of interleaving metal layers.

19. The method of claim 17, further comprising coupling a plurality of trenches to one or more of the plurality of interleaving metal layers.

20. The method of claim 19, further comprising arranging the trenches in an interdigital arrangement.

* * * * *